US011468808B2

(12) United States Patent
Kim et al.

(10) Patent No.: US 11,468,808 B2
(45) Date of Patent: Oct. 11, 2022

(54) DISPLAY DEVICE AND METHOD OF MANUFACTURING THE SAME

(71) Applicant: Samsung Display Co., Ltd., Yongin-si (KR)

(72) Inventors: Hongam Kim, Seoul (KR); Youngmin Cho, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/192,437

(22) Filed: Mar. 4, 2021

(65) Prior Publication Data
US 2022/0013048 A1  Jan. 13, 2022

(30) Foreign Application Priority Data

Jul. 10, 2020  (KR) .................. 10-2020-0085275

(51) Int. Cl.
*H01L 27/32* (2006.01)
*H01L 51/00* (2006.01)
(Continued)

(52) U.S. Cl.
CPC ........... *G09G 3/006* (2013.01); *G09G 3/3225* (2013.01); *H01L 27/323* (2013.01);
(Continued)

(58) Field of Classification Search
CPC .... G90G 3/006; G90G 3/3225; G90G 3/3291; G90G 3/3258; H01L 27/3223;
(Continued)

(56) References Cited

U.S. PATENT DOCUMENTS 9,917,113 B2  3/2018 Lee
10,276,646 B2  4/2019 Kim et al.
(Continued)

FOREIGN PATENT DOCUMENTS

EP  3 419 065  12/2018
EP  3 432 062  1/2019
(Continued)

OTHER PUBLICATIONS

Partial European search report for European Patent Application or Patent No. 21167969.1 dated Oct. 5, 2021.
(Continued)

*Primary Examiner* — Sardis F Azongha
(74) *Attorney, Agent, or Firm* — Kile Park Reed & Houtteman PLLC

(57) ABSTRACT

A display device includes a display panel including a display area displaying an image, a non-display area adjacent to the display area, and a plurality of signal lines, and a driving circuit disposed in the non-display area, wherein the driving circuit includes a plurality of bumps arranged in a plurality of rows. The plurality of bumps include a crack detection bump arranged in at least one row among the plurality of rows, the plurality of signal lines include a crack detection line electrically connected to the crack detection bump, and at least a portion of the crack detection line is disposed adjacent to an edge of the driving circuit.

23 Claims, 16 Drawing Sheets

(51) Int. Cl.
- *H01L 51/56* (2006.01)
- *G09G 3/00* (2006.01)
- *G09G 3/3225* (2016.01)
- *G09G 3/3266* (2016.01)
- *G09G 3/3275* (2016.01)

(52) U.S. Cl.
CPC ...... *H01L 27/3223* (2013.01); *H01L 27/3276* (2013.01); *H01L 51/0031* (2013.01); *H01L 51/0097* (2013.01); *H01L 51/56* (2013.01); *G09G 3/3266* (2013.01); *G09G 3/3275* (2013.01); *G09G 2380/02* (2013.01); *H01L 2227/323* (2013.01); *H01L 2251/5338* (2013.01)

(58) Field of Classification Search
CPC ............. H01L 27/3276; H01L 51/0031; H01L 51/0097; H01L 51/56
See application file for complete search history.

(56) References Cited

U.S. PATENT DOCUMENTS

| | | | |
|---|---|---|---|
| 10,997,881 B2* | 5/2021 | Shin | G09G 3/3233 |
| 2016/0218289 A1 | 7/2016 | Lee et al. | |
| 2017/0285376 A1 | 10/2017 | Okamae et al. | |
| 2018/0053466 A1* | 2/2018 | Zhang | H01L 27/3276 |
| 2018/0240384 A1* | 8/2018 | Li | G09G 3/3648 |
| 2018/0336808 A1 | 11/2018 | Lee et al. | |
| 2020/0090566 A1 | 3/2020 | Lee et al. | |
| 2020/0143722 A1 | 5/2020 | Lee et al. | |
| 2020/0219965 A1 | 7/2020 | Kim et al. | |

FOREIGN PATENT DOCUMENTS

| | | |
|---|---|---|
| KR | 10-2015-0144907 | 12/2015 |
| KR | 10-2016-0091526 | 8/2016 |
| KR | 10-2018-0066360 | 6/2018 |
| KR | 10-2018-0126116 | 11/2018 |
| KR | 10-2034072 | 10/2019 |

OTHER PUBLICATIONS

Extended European search report for European Patent Application or Patent No. 21167969.1 dated Mar. 2, 2022.

* cited by examiner

DISPLAY DEVICE AND METHOD OF MANUFACTURING THE SAME

CROSS-REFERENCE TO RELATED APPLICATION(S)

This U.S. non-provisional patent application claims priority to and benefit of Korean Patent Application No. 10-2020-0085275 under 35 U.S.C. § 119, filed in the Korean Intellectual Property Office (KIPO) on Jul. 10, 2020, the entire contents of which are hereby incorporated by reference.

BACKGROUND

1. Technical Field

The disclosure herein relates to a display device and a method of manufacturing the same, and more specifically, to a display device and a method of manufacturing the same with improved reliability by readily inspecting damage to a display panel, which may occur during a bonding process between a display panel and a driving circuit.

2. Description of Related Art

Display devices such as a television, a monitor, a smart phone, and a tablet that provide an image to a user include a display panel that displays an image. As a display panel, various display panels such as a liquid crystal display panel, an organic light emitting display panel, an electro wetting display panel, and an electrophoretic display panel are being developed.

With the recent technology development of a display device, a display device including a flexible display panel has been developed. The display panel includes pixels that display an image and a driving chip for driving the pixels. The pixels are disposed in the display area of the display panel, and the driving chip is disposed in the non-display area of the display panel surrounding the display area. A bent portion is defined between the driving chip and the display area, and the bent portion is bent so that the driving chip is disposed under the display panel.

SUMMARY

The disclosure provides a display device with improved reliability and a method of manufacturing the same.

The disclosure also provides a display device with improved reliability and a method of manufacturing the display device that can readily detect damage to a display panel that may have occurred in the bonding process of a driving circuit and a display panel including a flexible base layer.

An embodiment provides a display device including a display panel including a display area displaying an image, a non-display area adjacent to the display area, and a plurality of signal lines; and a driving circuit disposed in the non-display area. The driving circuit may include a plurality of bumps arranged in a plurality of rows, the plurality of bumps may include a crack detection bump arranged in at least one row among the plurality of rows, the plurality of signal lines may include a crack detection line electrically connected to the crack detection bump, and at least a portion of the crack detection line may be disposed adjacent to an edge of the driving circuit.

In an embodiment, the driving circuit may include at least one long side extending in a first direction parallel to the plurality of rows, and at least one short side extending in a second direction intersecting the first direction, and the at least a portion of the crack detection line may be disposed adjacent to the at least one short side.

In an embodiment, the crack detection line may be disposed adjacent to at least a portion of the at least one long side of the driving circuit.

In an embodiment, the display device may further include a circuit board including a plurality of circuit board pads electrically connected to the display panel.

In an embodiment, the crack detection line may be electrically connected to at least a part of the plurality of circuit board pads.

In an embodiment, the plurality of circuit board pads may include resistance test pads, and the crack detection line may be electrically connected to the resistance test pads.

In an embodiment, the at least one short side may include a first short side and a second short side spaced apart from the first short side in the first direction, and the crack detection line may include a left crack detection line disposed adjacent to the first short side, and a right crack detection line disposed adjacent to the second short side.

In an embodiment, the crack detection line may include a connection crack detection line that electrically connects the left crack detection line and the right crack detection line. The connection crack detection line may be disposed adjacent to one of the at least one long side of the driving circuit.

In an embodiment, the crack detection line may include a first detection line and a second detection line spaced apart from the driving circuit, and the first detection line may be disposed between the second detection line and the driving circuit.

In an embodiment, each of the first detection line and the second detection line may include a structure forming a loop structure through a plurality of detection lines extending along the edge of the driving circuit.

In an embodiment, the driving circuit may include a comparison unit electrically connected to the crack detection bump.

In an embodiment, the comparison unit may apply a weight to compensate for a difference in wiring resistance between the first detection line and the second detection line.

In an embodiment, the crack detection bump may include first to fourth crack detection bumps. The first detection line may include a first input detection line electrically connected to the first crack detection bump and a first output detection line electrically connected to the second crack detection bump. The second detection line may include a second input detection line electrically connected to the third crack detection bump and a second output detection line electrically connected to the fourth crack detection bump.

In an embodiment, the first detection line may have a structure in which the first input detection line and the first output detection line are connected to form a loop structure, and the second detection line may include a structure in which the second input detection line and the second output detection line are connected to form a loop structure.

In an embodiment, the driving circuit may include a connection line electrically connecting the crack detection bump and the comparison unit.

In an embodiment, the plurality of bumps may include an output bump and an input bump, the plurality of signal lines may include a data line electrically connected to the output bump or the input bump, and the data line and the crack detection line may be disposed on different layers.

In an embodiment, the crack detection bump may include a dummy bump disposed at an end of at least one row among the plurality of rows.

In an embodiment, the display panel may include a module crack detection line disposed in the non-display area and at an outermost side of the display panel.

In an embodiment, a display device includes a display panel including a display area displaying an image, a non-display area adjacent to the display area, and a plurality of signal lines; and a driving circuit disposed in the non-display area. The driving circuit may include a bump disposed in at least one row extending in a first direction, the bump may include a crack detection bump disposed in the at least one row, the driving circuit may include at least one long side extending in the first direction and at least one short side extending in a second direction intersecting the first direction, and at least a part of the plurality of signal lines may include a crack detection line disposed adjacent to the at least one short side of the driving circuit.

In an embodiment, a method of manufacturing a display device may include preparing a display panel including a display area displaying an image, a non-display area adjacent to the display area, and a crack detection line disposed in the non-display area; preparing a driving circuit including at least one long side extending in a first direction and at least one short side extending in a second direction intersecting the first direction; pressing the driving circuit to the display panel so that the at least one short side of the driving circuit is disposed adjacent to the crack detection line; and determining whether a crack has occurred by measuring a resistance of the crack detection line.

In an embodiment, the method may further include electrically connecting a circuit board including a plurality of circuit board pads to the display panel, wherein the crack detection line may be electrically connected to resistance test pads among the plurality of circuit board pads, and the resistance test pads may measure a resistance of the crack detection line to determine whether a crack has occurred.

In an embodiment, the driving circuit may include a crack detection bump electrically connected to the crack detection line; and a comparison unit electrically connected to the crack detection bump, and the comparison unit may measure a resistance of the crack detection line to determine whether a crack has occurred.

In an embodiment, the crack detection line may include a first detection line and a second detection line spaced apart from the driving circuit, the first detection line is disposed between the second detection line and the driving circuit, and the comparison unit may compare resistances of the first detection line and the second detection line to determine whether a crack has occurred in the crack detection line.

BRIEF DESCRIPTION OF THE DRAWINGS

An additional appreciation according to the embodiments of the invention will become more apparent by describing in detail some embodiments thereof with reference to the accompanying drawings, wherein.

DETAILED DESCRIPTION OF THE EMBODIMENTS

Figure 1:
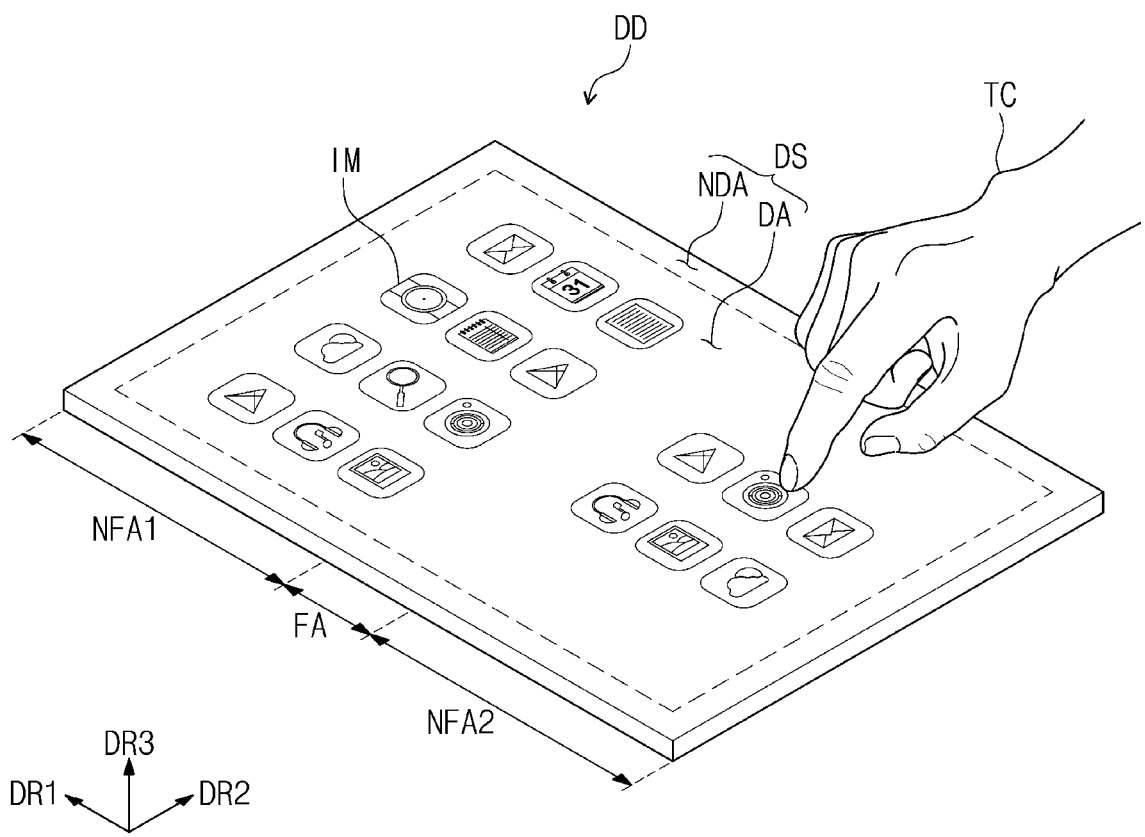
FIG. 1 is a schematic perspective view of a display device according to an embodiment.

Since the disclosure may have diverse modified embodiments, some embodiments are illustrated in the drawings and are described in the detailed description of the invention. However, this does not limit the disclosure within specific embodiments, and it should be understood that the disclosure covers all the modifications, equivalents, and replacements within the idea and technical scope of the invention.

The same reference numbers indicate the same components throughout the disclosure. Like reference numerals refer to like elements throughout the specification. In the accompanying figures, the thickness, ratio, and dimension of components may be exaggerated for effective description of the technical content.

It will be understood that when an element such as a component, layer, film, region, or substrate is referred to as being "on," "connected to," or "coupled to" another element, it can be directly on, or connected or coupled to the another element or intervening elements may also be present. In contrast, when an element is referred to as being "directly on" another element, there are no intervening elements present. The word "on" or "above" means positioned on or below the object portion and does not necessarily mean positioned on the upper side of the object portion based on a gravitational direction.

As used herein, the term "and/or" includes any and all combinations of one or more of the associated listed items. For example, "A and/or B" may be understood to mean "A, B, or A and B."

It will be understood that, although the terms "first," "second," or the like may be used herein to describe various elements, components, regions, layers and/or sections, these elements, components, regions, layers and/or sections should not be limited by these terms. These terms are only used to distinguish an element, component, region, layer or section from another region, layer or section. Thus, a first element, component, region, layer or section discussed below could be termed a second element, component, region, layer or section without departing from the scope of the claims. The singular forms, "a," "an" and "the" are intended to include the plural forms as well, unless referred to the contrary.

The terms "under," "below," "above," "upper," "lower," "adjacent," and the like are used for explaining relation association of components illustrated in the drawings. The terms may be a relative concept and described based on directions illustrated in the drawings. It will also be understood that when an element or layer is referred to as being "on" another one, it can be disposed on the upper portion or the lower portion of another one.

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be further understood that the terms "comprise," "include," "have," and the like, when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, a display device, a display panel included in the display device, and a method of manufacturing the display panel according to an embodiment will be explained in detail with reference to the accompanying drawings.

Figure 2:
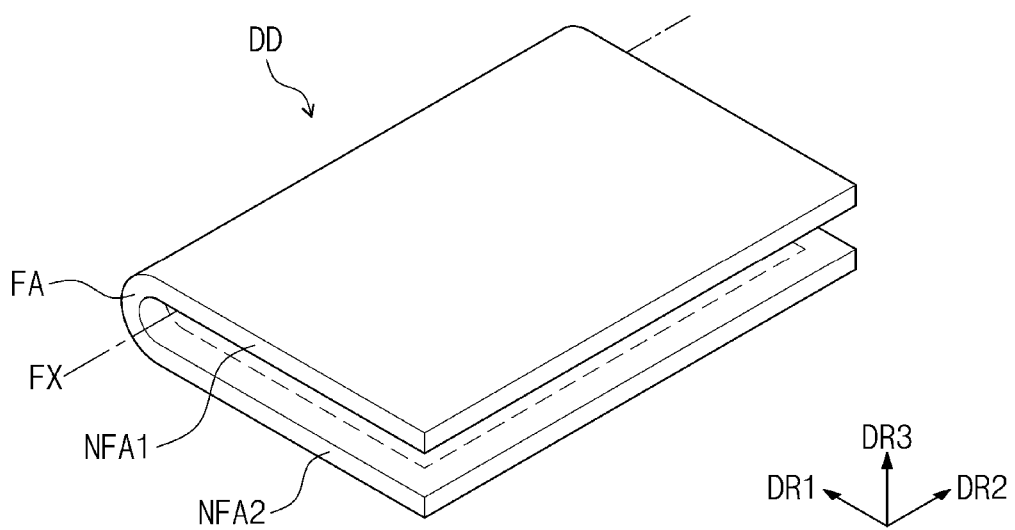
FIG. 2 is a schematic perspective view illustrating a folded state of a display device according to an embodiment.

FIG. 1 is a schematic perspective view of a display device according to an embodiment. FIG. 2 is a schematic diagram illustrating a folded state of the display device illustrated in FIG. 1.

Referring to FIG. 1, a display device DD according to an embodiment may have a rectangular shape with long sides extending in a first direction DR1 and short sides extending in a second direction DR2 intersecting the first direction DR1. However, the embodiments are not limited thereto, and the display device DD may have various shapes such as a circle and a polygon. The display device DD may be a flexible display device.

Hereinafter, the direction substantially perpendicular to the plane defined by the first direction DR1 and the second direction DR2 is defined as a third direction DR3. In the specification, "when viewed from the plane" or "in a plan view" may be defined as a viewing an object from above in the third direction DR3.

The display device DD may include a folding area FA and non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The folding area FA, the first non-folding area NFA1, and the second non-folding area NFA2 may be arranged in the first direction DR1.

For example, one folding area FA and two non-folding areas NFA1 and NFA2 are illustrated, but the number of folding area FA and non-folding areas NFA1 and NFA2 is not limited thereto. For example, the display device DD may include more than two non-folding areas and multiple folding areas disposed between the non-folding areas.

The upper surface of the display device DD may be defined as the display surface DS and may include a plane or layer defined by the first direction DR1 and the second direction DR2. The images IM generated by the display device DD may be provided to the user through the display surface DS.

The display surface DS may include a display area DA and a non-display area NDA around the display area DA. The display area DA may display an image, and the non-display area NDA may not display an image. The non-display area NDA may surround or be adjacent to the display area DA and may define an outline portion of the display device DD printed in a predetermined color.

The display device DD may detect an external input TC applied from the outside. The external input TC may include various types of inputs provided from the outside of the display device DD. The external input TC may be provided in various forms.

For example, the external input TC may include an external input (e.g., hovering) that is applied close to or spaced a predetermined distance from the display device DD and a contact by a portion of the body, such as a user's hand. Further, it may have various forms such as force, pressure, and light, and is not limited to any one form. In FIG. 1, a user's hand is displayed as an example of an external input TC.

Referring to FIG. 2, the display device DD may be a foldable display device DD that is folded or unfolded. For example, the folding area FA may be bent or folded along the folding axis FX parallel to the second direction DR2, so that the display device DD may be folded. The folding axis FX may be defined as a short axis parallel to the short side of the display device DD.

In case that the display device DD is folded, the first non-folding area NFA1 and the second non-folding areas NFA2 face each other, and the display device DD may be in-folded to prevent the display surface DS from being exposed to the outside.

Figure 3:
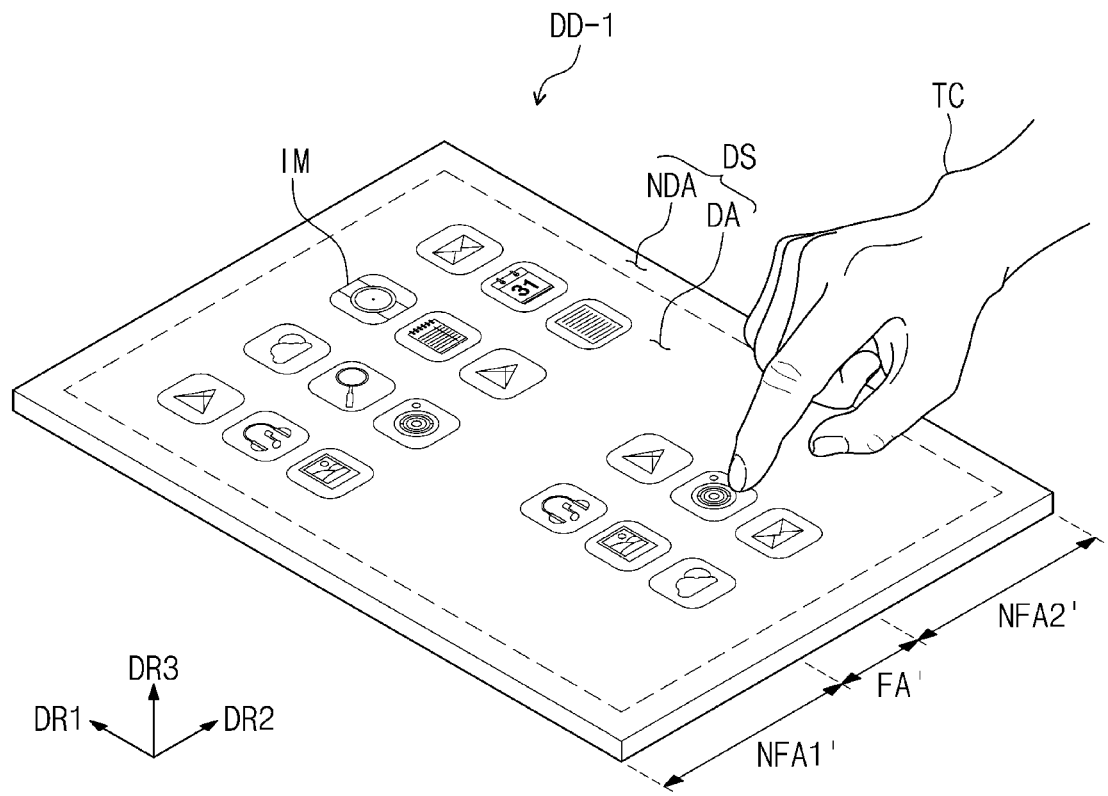
FIG. 3 is a schematic perspective view of a display device according to an embodiment.
Figure 4:
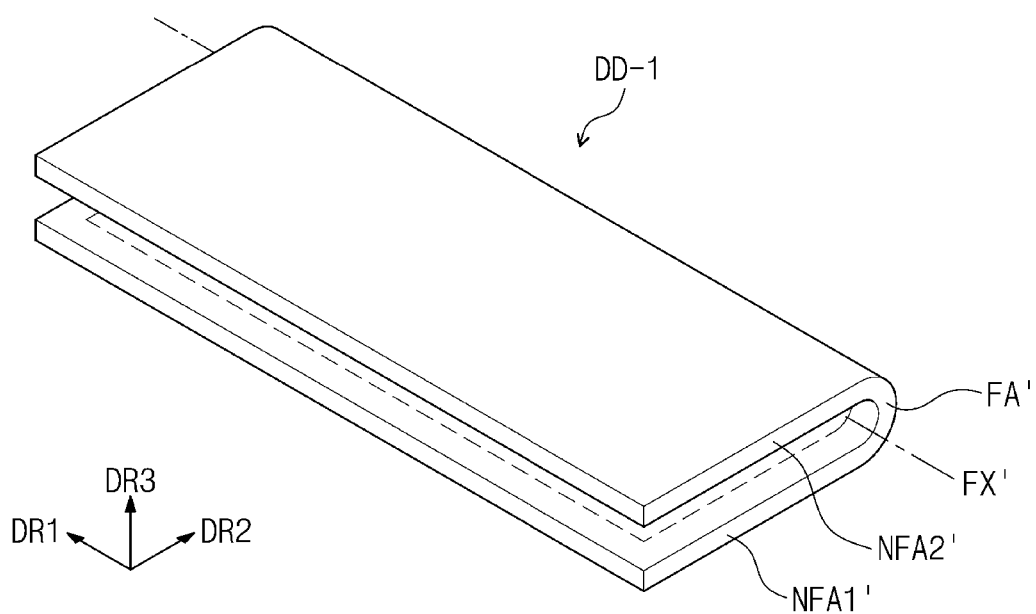
FIG. 4 is a schematic perspective view illustrating a folded state of a display device according to an embodiment.

FIG. 3 is a schematic perspective view of a display device according to an embodiment. FIG. 4 is a schematic diagram illustrating a folded state of the display device illustrated in FIG. 3 folded.

Except for the folding operation, a display device DD-1 illustrated in FIG. 3 and the display device DD illustrated in FIG. 1 may have substantially the same configuration. Accordingly, the folding operation of the display device DD-1 will be described below.

Referring to FIGS. 3 and 4, the display device DD-1 may include a folding area FA' and multiple non-folding areas NFA1' and NFA2'. The non-folding areas NFA1' and NFA2' may include a first non-folding area NFA1' and a second non-folding area NFA2'. The folding area FA' may be disposed between the first non-folding area NFA1' and the second non-folding area NFA2'. The folding area FA', the first non-folding area NFA1', and the second non-folding area NFA2' may be arranged in the second direction DR2.

The folding area FA' is bent or folded along the folding axis FX' parallel to the first direction DR1, so that the display device DD-1 may be folded. The folding axis FX' may be defined as a long axis parallel to the long side of the display device DD-1. The display device DD illustrated in FIG. 1 may be folded along a short axis, and unlike this, the display device DD-1 illustrated in FIG. 3 may be folded on a long axis. The display device DD-1 may be in-folded so that the display surface DS is not exposed to the outside.

Hereinafter, for example, the display device DD that is in-folded along the folding axis FX parallel to the short axis will be described. However, the embodiments are not limited thereto, and the display device may be in-folded along a folding axis parallel to a long axis or may be out-folded along a folding axis defined below or under the display device.

Figure 5A:
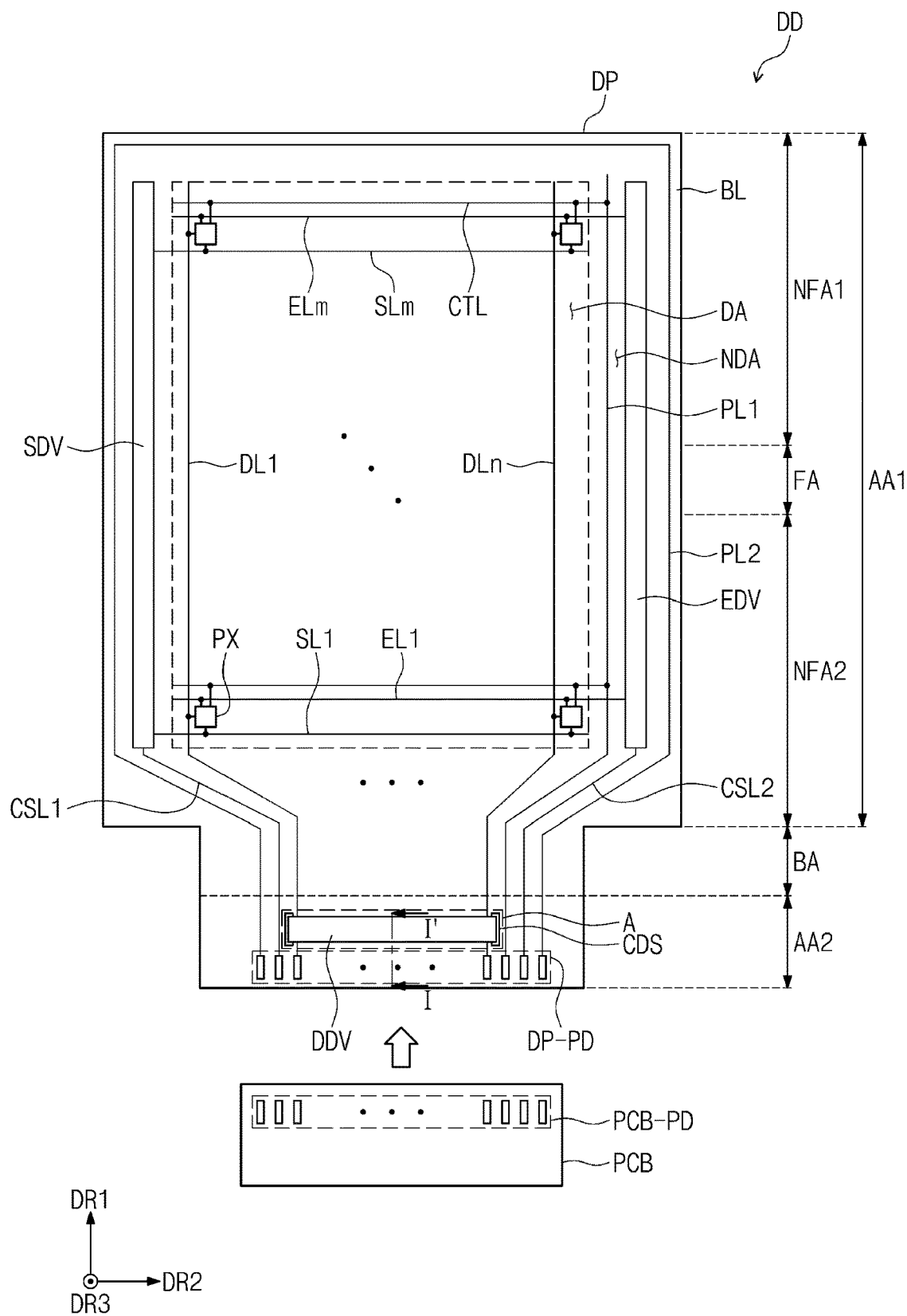
FIG. 5A is a schematic plan view of a display device according to an embodiment.
Figure 5B:
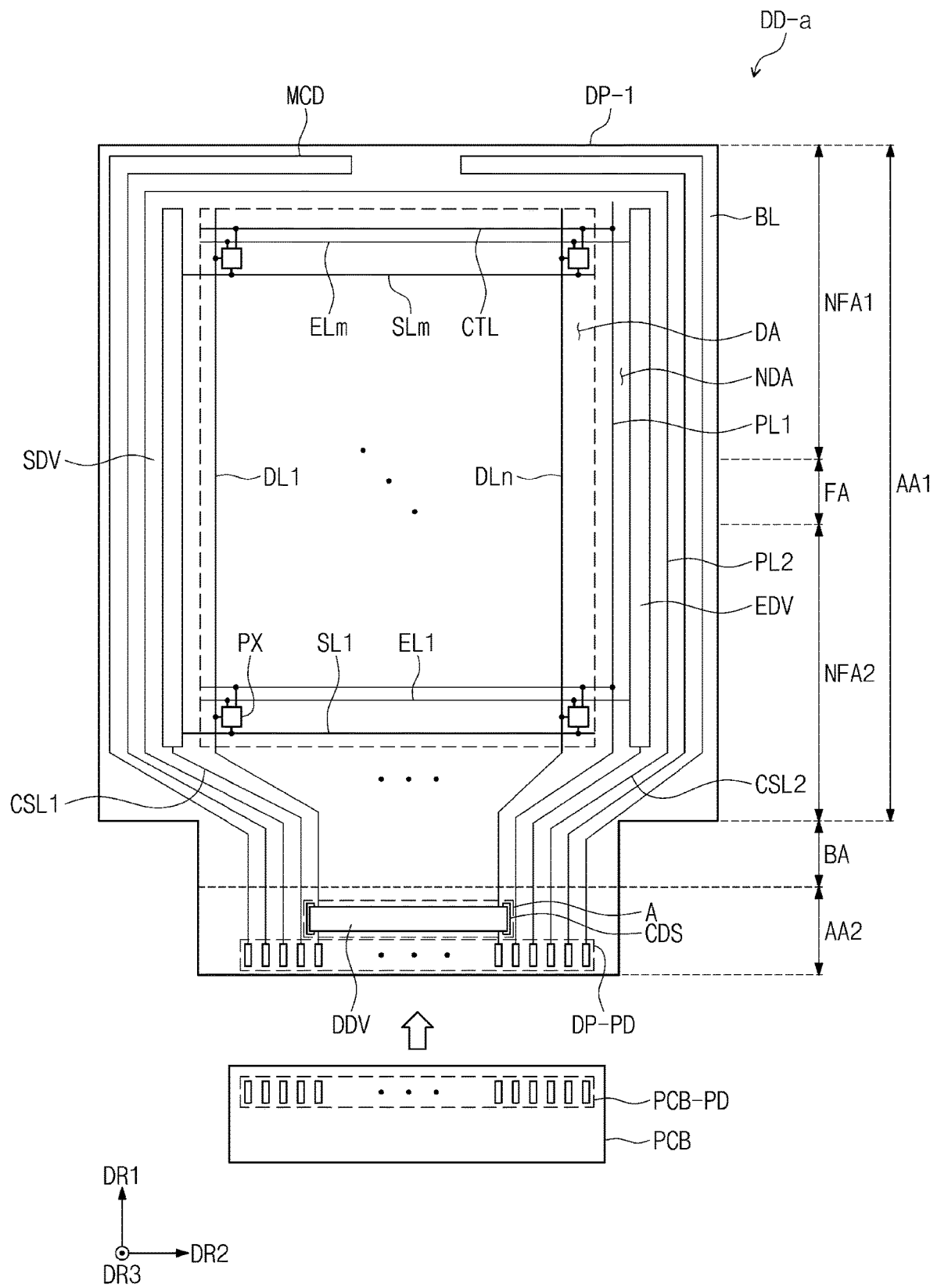
FIG. 5B is a schematic plan view of a display device according to an embodiment.

FIG. 5A is a schematic plan view illustrating a display device according to an embodiment. FIG. 5B is a schematic plan view of a display device according to another embodiment. FIG. 5A is a schematic plan view of the display device DD illustrated in FIG. 1. FIG. 5B is a schematic plan view illustrating a display device DD-a according to another embodiment among the display device(s) illustrated in FIG. 1.

Referring to FIG. 5A, the display device DD may include a display panel DP, a scan driver SDV, a data driver DDV, and an emission driver EDV.

The display panel DP may be a light emitting display panel, but the embodiments are not limited thereto. For example, the display panel DP may be an organic light emitting display panel or a quantum dot light emitting display panel. In the organic light emitting display panel, the light emitting layer may include an organic light emitting material. The light emitting layer of the quantum dot light emitting display panel may include quantum dot, quantum rod, or the like. Hereinafter, the display panel DP is described as the organic light emitting display panel.

The display panel DP may be a flexible display panel. For example, the display panel DP may include electronic elements disposed on a flexible substrate. The display panel DP may extend longer in the first direction DR1 than in the second direction DR2. The display panel DP may include a plane or a layer defined by the first and second directions DR1 and DR2.

The display panel DP may include a first area AA1, a second area AA2, and a bending area BA disposed between the first area AA1 and the second area AA2. The bending area BA may extend in the second direction DR2, and the first area AA1, the bending area BA, and the second area AA2 may be arranged in the first direction DR1.

The first area AA1 may have long sides extending in the first direction DR1 and opposite to each other in the second direction DR2. Lengths of the bending area BA and the second area AA2 may be smaller than the length of the first area AA1 in the second direction DR2.

The first area AA1 may include the display area DA and the non-display area NDA around or adjacent to the display area DA. The non-display area NDA may surround the display area DA. The display area DA may be an area for displaying an image, and the non-display area NDA may be an area for not displaying an image. The second area AA2 and the bending area BA may be areas that do not display an image.

When viewed in the first direction DR1, the first area AA1 may include a first non-folding area NFA1, a second non-folding area NFA2, and a folding area FA between the first and second non-folding areas NFA1 and NFA2.

The display panel DP may include pixels PX, scan lines SL1 to SLm, data lines DL1 to DLn, emission lines EL1 to ELm, first and second control lines CSL1 and CSL2, a first power line PL1, a second power line PL2, connection circuit lines CTL, and signal pads DP-PD, where m and n are natural numbers. The pixels PX may be disposed in the display area DA and may be electrically connected to the scan lines SL1 to SLm, the data lines DL1 to DLn, and the emission lines EL1 to ELm.

The scan driver SDV and the emission driver EDV may be disposed in the non-display area NDA. The scan driver SDV and the emission driver EDV may be disposed in the non-display area NDA adjacent to the long sides of the first area AA1, respectively. The data driver DDV may be disposed in the second area AA2. The data driver DDV may be manufactured in the form of an integrated circuit chip and mounted on the second area AA2.

The scan lines SL1 to SLm may extend in the second direction DR2 and may be electrically connected to the scan driver SDV. The data lines DL1 to DLn extend in the first direction DR1 and may be electrically connected to the data driver DDV through the bending area BA. The emission lines EL1 to ELm may extend in the second direction DR2 to be connected to the emission driver EDV.

The first power line PL1 may extend in the first direction DR1 and may be disposed in the non-display area NDA. The first power line PL1 may be disposed between the display area DA and the emission driver EDV. However, the embodiments are not limited thereto, and the first power line PL1 may be disposed between the display area DA and the scan driver SDV.

The first power line PL1 may extend to the second area AA2 through the bending area BA. The first power line PL1 may extend toward a lower end of the second area AA2 in a plan view. The first power line PL1 may receive a first voltage.

The second power line PL2 may be disposed in the non-display area NDA adjacent to the long sides of the first area AA1 and the non-display area NDA facing the second area AA2 with the display area DA interposed therebetween. The second power line PL2 may be disposed outside the scan driver SDV and the emission driver EDV.

The second power line PL2 may extend to the second area AA2 through the bending area BA. The second power line PL2 may extend in the first direction DR1 in the second area AA2 with the data driver DDV therebetween. The second area AA2 may extend toward a lower end of the second area AA2 in a plan view.

The second power line PL2 may receive a second voltage having a lower level than the first voltage. For convenience of explanation, the connection relationship is not shown, and the second power line PL2 may extend to the display area DA and may be electrically connected to the pixels PX, and a second voltage may be provided to the pixels PX through the second power line PL2.

The connection circuit lines CTL may extend in the second direction DR2 and may be arranged in the first direction DR1. The connection circuit lines CTL may be electrically connected to the first power line PL1 and the pixels PX. The first voltage may be applied to the pixels PX through the first power line PL1 and the connection circuit lines CTL electrically connected to each other.

The first control line CSL1 may be electrically connected to the scan driver SDV and may extend toward the lower end of the second area AA2 through the bending area BA. The second control line CSL2 may be electrically connected to the emission driver EDV and may extend toward the lower end of the second area AA2 through the bending area BA. The data driver DDV may be disposed between the first control line CSL1 and the second control line CSL2.

In a plan view, the signal pads DP-PD may be disposed adjacent to the lower end of the second area AA2. The data driver DDV, the first power line PL1, the second power line PL2, the first control line CSL1, and the second control line CSL2 may be electrically connected to the signal pads DP-PD.

The data lines DL1 to DLn may be electrically connected to the corresponding signal pads DP-PD through a data driver DDV. For example, the data lines DL1 to DLn may be electrically connected to the data driver DDV, and the data driver DDV may be electrically connected to the signal pads DP-PD respectively corresponding to the data lines DL1 to DLn.

The timing controller may control operations of the scan driver SDV, the data driver DDV, and the emission driver EDV. The timing controller may generate a scan control signal, a data control signal, and an emission control signal in response to control signals received from the outside.

The scan control signal may be provided to the scan driver SDV through the first control line CSL1. The emission control signal may be provided to the emission driver EDV through the second control line CSL2. The data control signal may be provided to a data driver DDV. The timing controller receives the image signals from the outside, converts the data format of the image signals to match the interface specification with the data driver DDV, and provides the converted image data to the data driver DDV.

The scan driver SDV may generate scan signals in response to the scan control signal. The scan signals may be applied to the pixels PX through the scan lines SL1 to SLm. The scan signals may be sequentially applied to the pixels PX.

The data driver DDV may generate data voltages corresponding to the image signals in response to the data control signal. The data voltages may be applied to the pixels PX through the data lines DL1 to DLn. The emission driver EDV may generate emission signals in response to the emission control signal. The emission signals may be applied to the pixels PX through the emission lines EL1 to ELm. The data driver DDV, the scan driver SDV, and the emission driver EDV may be referred to as a driving circuit according to an embodiment, and hereinafter, in describing the driving circuit according to an embodiment, the data driver DDV is described as an example, and the data driver DDV is referred to as a driving circuit.

A crack detection line CDS is disposed on the second area AA2 of the display panel DP to be adjacent to one side of the data driver DDV. The crack detection line CDS is disposed adjacent to a side of the data driver DDV to detect defects such as cracks occurring in the peripheral area of the data driver DDV. Hereinafter, description of the data driver DDV and the crack detection line CDS will be described below. In this specification, a data line, a scan line, an emission line, a control line, a connection line, and a crack detection line are referred to as signal lines disposed on the display panel.

The pixels PX may be provided with the data voltages in response to the scan signals. The pixels PX may display an image by emitting light having luminance corresponding to data voltages in response to emission signals. The emission time of the pixels PX may be controlled by emission signals.

Each of the pixels PX may include an organic light emitting element. A first voltage may be applied to the anode electrode of the organic light emitting element, and a second voltage may be applied to the cathode electrode of the organic light emitting element. The organic light emitting element may operate by receiving a first voltage and a second voltage.

The display device DD may further include a circuit board PCB electrically connected to the display panel DP. The circuit board PCB may be a rigid circuit board or a flexible circuit board.

A timing control circuit for controlling the operation of the display panel DP may be disposed on the circuit board PCB. An input detection circuit for controlling the input detection unit ISP (see FIG. 6) may also be disposed on the circuit board PCB. Each of the timing control circuit and the input detection circuit may be mounted on a circuit board PCB in the form of an integrated chip. In an embodiment, the timing control circuit and the input detection circuit may be mounted on a circuit board PCB in the form of an integrated chip. The circuit board PCB may include circuit board pads PCB-PD electrically connected to the signal pads DP-PD of the display panel. Although not shown in the drawings, the circuit board PCB may further include signal lines electrically connecting the circuit board pads PCB-PD to the timing control circuit and/or the input detection circuit. The circuit board pads PCB-PD may be output pads, and the circuit board PCB may further include an input pad.

Referring to FIG. 5B, the display panel DP-1 included in the display device DD-a according to an embodiment may further include a module crack detection line MCD. The module crack detection line MCD may be disposed in the non-display area NDA of the first area AA1 of the display panel DP-1 and may be disposed at the outermost side of the display panel DP. For example, the module crack detection line MCD may be disposed outside the configuration of the scan driver SDV, the emission driver EDV, and the second power line PL2, and may be disposed adjacent to the outer line of the display device DD-a.

The module crack detection line MCD may detect defects such as cracks occurring in the outermost area of the display device DD-a. The module crack detection line MCD may be electrically connected to at least one of the signal pads DP-PD of the display panel DP-1, and the signal pads DP-PD of the display panel DP-1 may be electrically connected to the circuit board pads PCB-PD of the circuit board PCB. Although not shown, the circuit board PCB may further include a crack detection circuit that receives an electrical signal from the module crack detection line MCD and determines whether a crack has occurred in the outermost area of the display device DD-a. However, the embodiments are not limited thereto, and the module crack detection line MCD may be electrically connected to the driving circuit DDV, and in this case, the driving circuit DDV may further include a crack detection circuit for determining whether a crack has occurred in the outermost area of the display device DD-a.

Figure 6:
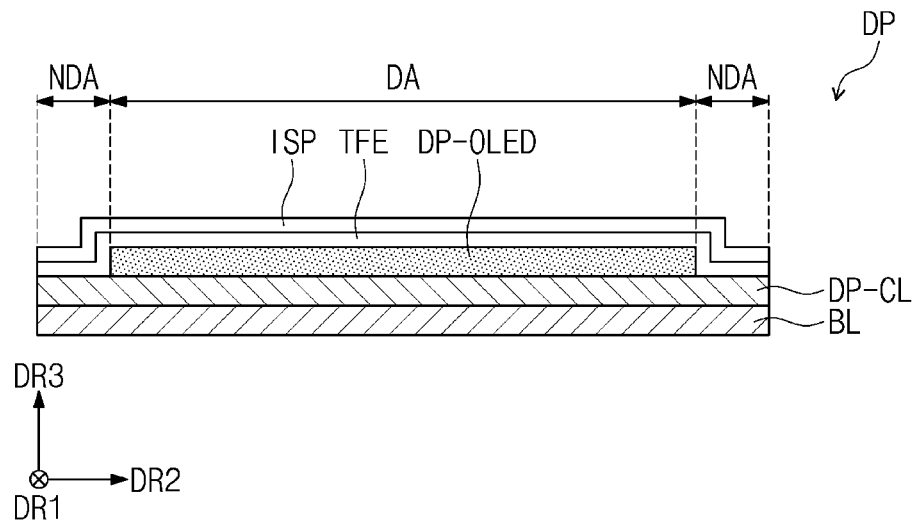
FIG. 6 is a schematic cross-sectional view of a display panel according to an embodiment.

FIG. 6 is a schematic diagram illustrating a cross-section of a display panel according to an embodiment. For example, in FIG. 6, a cross section of the display panel DP viewed from the first direction DR1 is illustrated.

Referring to FIG. 6, the display panel DP may include a base layer BL, a circuit element layer DP-CL disposed on the base layer BL, a display element layer DP-OLED disposed on the circuit element layer DP-CL, a thin film sealing layer TFE disposed on the display element layer DP-OLED, and an input detection unit ISP disposed on the thin film sealing layer TFE. The display element layer DP-OLED may be disposed on the display area DA.

The base layer BL may include the display area DA and the non-display area NDA around the display area DA. The base layer BL may include a flexible material. The base layer BL may include a flexible plastic material. For example, the base layer BL may include polyimide (PI). The base layer BL may include polyimide having a low modulus.

The circuit element layer DP-CL may include an insulating layer, a semiconductor pattern, a conductive pattern, and a signal line. An insulating layer, a semiconductor layer, and a conductive layer may be formed on the base layer BL by coating and evaporation. Thereafter, the insulating layer, the semiconductor layer, and the conductive layer may be selectively patterned by photolithography processes to form a semiconductor pattern, a conductive pattern, and a signal line.

The circuit element layer DP-CL may include transistors formed of a semiconductor pattern, a conductive pattern, and a signal line. The display element layer DP-OLED may include light emitting elements electrically connected to transistors. The pixels PX may include transistors and light emitting elements.

The thin film sealing layer TFE may be disposed on the circuit element layer DP-CL to cover or overlap the display element layer DP-OLED. The thin film sealing layer TFE may include an inorganic material layer, an organic material layer, and an inorganic material layer sequentially stacked. The inorganic material layers may include an inorganic material and may protect the pixels from moisture or oxygen. The organic material layer may include an organic material and may protect the pixels PX from foreign substances such as dust particles.

The input detection unit ISP may include sensors (not shown) for detecting an external input TC (see FIG. 1). The sensors may detect the external input TC (see FIG. 1) by a capacitive method. The external input TC (see FIG. 1) may include various types of inputs such as part of the user's body, light, heat, pen, or pressure.

When manufacturing the display panel DP, the input detection unit ISP may be manufactured directly on the thin film sealing layer TFE. However, the embodiments are not limited thereto, and the input detection unit ISP may be manufactured as a panel separated from the display panel DP and then, attached to the display panel DP by an adhesive.

Figure 7:
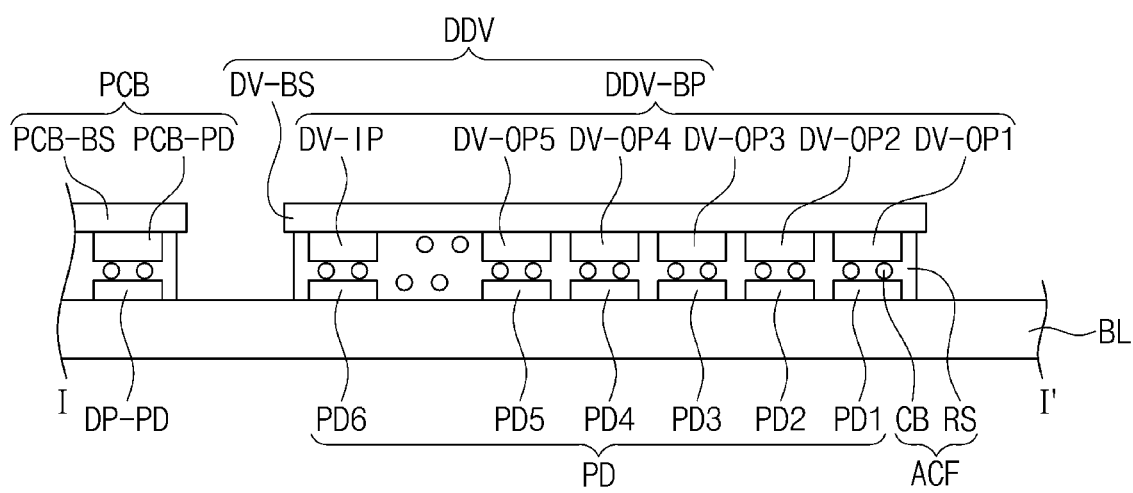
FIG. 7 is a schematic partial cross-sectional view of a display device according to an embodiment.

FIG. 7 is a schematic partial cross-sectional view of a display device according to an embodiment. FIG. 7 is a schematic cross-sectional view taken along line I-I' shown in FIG. 5A.

Referring to FIGS. 5A, 5B, and 7, the driving circuit DDV according to an embodiment includes a driving chip DV-BS and bumps DDV-BP. The driving chip DV-BS provides a base surface on which components such as the bumps DDV-BP are disposed. The bumps DDV-BP may be disposed in rows on the driving chip DV-BS. The bumps DDV-BP may include an input bump DV-IP that receives control signals and power provided from the circuit board PCB and may output bumps DV-OP1, DV-OP2, DV-OP3, DV-OP4, and DV-OP5 for driving the display panel DP. The output bumps DV-OP1, DV-OP2, DV-OP3, DV-OP4, and DV-OP5 are provided in multiple rows, and as shown in FIG. 7, may include first bumps DV-OP1, second bumps DV-OP2, third bumps DV-OP3, fourth bumps DV-OP4, and fifth bumps DV-OP5, which are provided in five rows. However, the embodiments are not limited thereto. For example, the output bumps DV-OP1, DV-OP2, DV-OP3, DV-OP4, and DV-OP5 may be arranged in 2 to 4 rows or 6 or more rows. Hereinafter, a detailed description of the plurality of bumps DDV-BP included in the driving circuit DDV will be described below.

Multiple pads PD corresponding to the bumps DDV-BP may be included on the base layer BL of the display panel DP. The pads PD respectively correspond to the bumps DDV-BP, and may include a first pad PD1, a second pad PD2, a third pad PD3, a fourth pad PD4, a fifth pad PD5, and a sixth pad PD6. The first pad PD1, the second pad PD2, the third pad PD3, the fourth pad PD4, and the fifth pad PD5 may be arranged to correspond to the plurality of output bumps DV-OP1, DV-OP2, DV-OP3, DV-OP4, and DV-OP5, and the sixth pad PD6 may be disposed to correspond to the input bump DV-IP.

An anisotropic conductive film ACF is disposed between the display panel DP and the driving circuit DDV, and the display panel DP and the driving circuit DDV may be attached to each other by the anisotropic conductive film ACF. The anisotropic conductive film ACF may include an adhesive resin RS and conductive particles CB. In the anisotropic conductive film ACF, the conductive particles CB are disposed between the bumps DDV-BP and the pads PD to electrically connect the bumps DDV-BP to the pads PD. The display panel DP and the driving circuit DDV may be attached and electrically connected to each other with the anisotropic conductive film ACF therebetween by a pressing and heating process. However, the embodiments are not limited thereto, and the anisotropic conductive film ACF is omitted in the display device DD of an embodiment, and the display panel DP and the driving circuit DDV may be electrically connected by an ultrasonic bonding process or the like.

The circuit board PCB may be electrically connected to the display panel DP through the anisotropic conductive film ACF. The circuit board PCB may include a circuit base layer PCB-BS and circuit board pads PCB-PD disposed on the circuit base layer PCB-BS and electrically connected to the signal pads DP-PD of the display panel DP.

Hereinafter, a specific arrangement of a plurality of bumps of the driving circuit DDV will be described with reference to FIG. 8.

Figure 8:
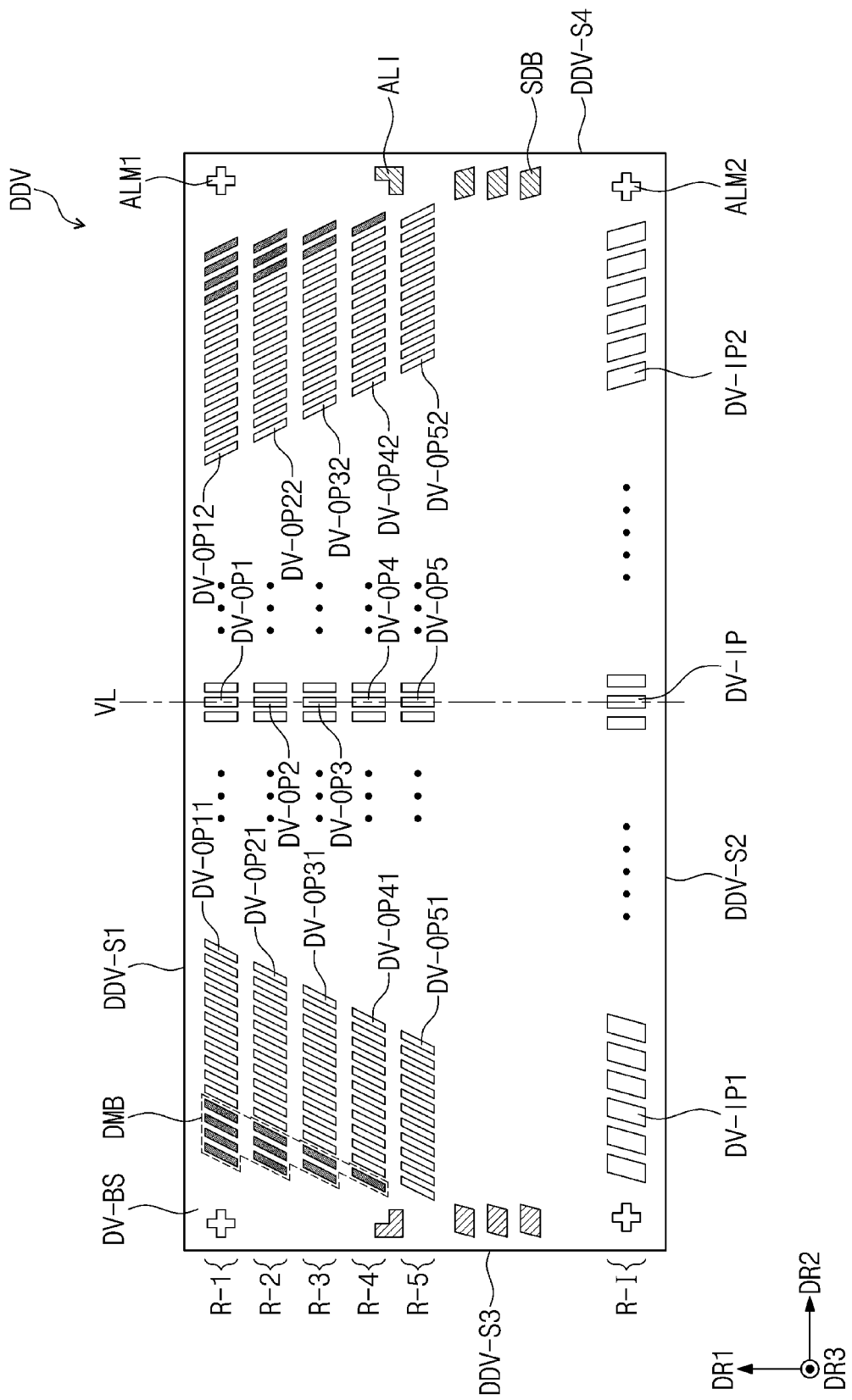
FIG. 8 is a schematic plan view showing an arrangement of bumps of a driving circuit according to an embodiment.

FIG. 8 is a schematic plan view showing an arrangement of bumps of a driving circuit according to an embodiment.

Referring to FIGS. 7 and 8 together, the bumps DDV-BP may include an output bump including first bumps DV-OP1, second bumps DV-OP2, third bumps DV-OP3, fourth bumps DV-OP4, and fifth bumps DV-OP5, which are arranged in output rows R-1, R-2, R-3, R-4, and R-5, and an input bump DV-IP disposed on the input row R-I. FIGS. 7 and 8 illustrate that the output bump includes five output rows R-1, R-2, R-3, R-4, and R-5, but the embodiments are not limited thereto. The output bumps may be arranged in 2 to 4 rows, or 6 or more rows. Among the output rows R-1, R-2, R-3, R-4, and R-5, the first row R-1 may be the row closest to the display area DA (see FIGS. 5A and 5B) when applied to the display device according to an embodiment. For example, the first row R-1 may be defined adjacent to the first long side DDV-S1 adjacent to the display area DA among the long sides DDV-S1 and DDV-S2 of the driving circuit DDV. The input row R-1 may be defined adjacent to the second long side DDV-S2 spaced apart from the display area DA. Although not shown in the drawing, the driving circuit DDV may further include output bumps and signal lines respectively connected to the input bumps. Each of the output bumps and the input bumps may be disposed in the second direction DR2 and may be spaced apart in the first direction DR1. Long sides DDV-S1 and DDV-S2 of the driving circuit DDV may extend in the second direction DR2, and short sides DDV-S3 and DDV-S4 of the driving circuit DDV may extend in the first direction DR1. Hereinafter, in the specification, the first direction DR1 may be referred to as a column direction, and the second direction DR2 may be referred to as a row direction.

First bumps DV-OP1, second bumps DV-OP2, third bumps DV-OP3, fourth bumps DV-OP4, and fifth bumps DV-OP5 may each include n bumps, where n is a natural number. For example, the number of each bump forming the first bumps DV-OP1, the second bumps DV-OP2, the third bumps DV-OP3, the fourth bumps DV-OP4, and the fifth bumps DV-OP5 may be the same. However, the embodiments are not limited thereto, and the number of bumps arranged in each column may be different depending on the structure of the display device.

The first reference bump disposed in the center of the first bumps DV-OP1 and the second reference bump disposed in the center of the second bumps DV-OP2 may be disposed on the reference line VL defined in the first direction DR1. A third reference bump disposed at the center of the third bumps DV-OP3 may also be disposed on the reference line VL. Similarly, the fourth reference bump disposed at the center of the fourth bumps DV-OP4 may also be disposed on the reference line VL, and the fifth reference bump disposed at the center of the fifth bumps DV-OP5 may also be disposed on the reference line VL.

The first bumps DV-OP1 may include 1-1-th bumps DV-OP11 disposed relatively to the left and 1-2-th bumps DV-OP12 disposed relatively to the right with respect to the first reference bump.

Similar to the plurality of first bumps DV-OP1, the second bumps DV-OP2 may include 2-1-th bumps DV-OP21 disposed relatively to the left and 2-2-th bumps DV-OP22 disposed relatively to the right with respect to the second reference bump. The third bumps DV-OP3 may include 3-1-th bumps DV-OP31 disposed relatively to the left and 3-2-th bumps DV-OP32 disposed relatively to the right with respect to the third reference bump. Likewise, the fourth bumps DV-OP4 may include 4-1-th bumps DV-OP41 disposed relatively to the left and 4-2-th bumps DV-OP42 disposed relatively to the right with respect to the fourth reference bump, and the fifth bumps DV-OP5 may include 5-1-th bumps DV-OP51 disposed relatively to the left and 5-2-th bumps DV-OP52 disposed relatively to the right with respect to the 5th reference bump.

The 1-1-th bumps DV-OP11, 2-1-th bumps DV-OP21, 3-1-th bumps DV-OP31, 4-1-th bumps DV-OP41, and 5-1-th bumps DV-OP51, which are disposed to the left with respect to the reference line VL, are each arranged to have a predetermined slope with respect to the reference line VL. The predetermined slope may be a slope having a constant value, that is, a constant slope. For example, the 1-1-th bumps DV-OP11, the 2-1-th bumps DV-OP21, the 3-1-th bumps DV-OP31, the 4-1-th bumps DV-OP41, and the 5-1-th bumps DV-OP51 may be arranged to form an acute angle clockwise with respect to the reference line VL. Symmetrically, the 1-2-th bumps DV-OP12, the 2-2-th bumps DV-OP22, the 3-2-th bumps DV-OP32, the 4-2-th bumps DV-OP42, and the 5-2-th bumps DV-OP52, which are disposed to the right side with respect to the reference line VL, may be arranged to form an acute angle counterclockwise with respect to the reference line VL.

In case that the number of the first bumps DV-OP1 and the second bumps DV-OP2 are the same, the slope of the n-th disposed bump of the first bumps DV-OP1 and the slope of the n-th disposed bump of the second bumps DV-OP2 may be the same. Likewise, in case that the number of each of the first bumps DV-OP1, the third bumps DV-OP3, the fourth bumps DV-OP4, and the fifth bumps DV-OP5 may be the same, each of the slope of the n-th disposed bump of the first bumps DV-OP1, the slope of the n-th disposed bump of the third bumps DV-OP3, the slope of the n-th disposed bump of the fourth bumps DV-OP4, and the slope of the n-th disposed bump of the fifth bumps DV-OP5 may be the same.

The pitch between the first bumps DV-OP1 may be smaller than the pitch between the second bumps DV-OP2. The pitch between the second bumps DV-OP2 may be smaller than the pitch between the third bumps DV-OP3. The pitch between the third bumps DV-OP3 may be smaller than the pitch between the fourth bumps DV-OP4. A pitch between the fourth bumps DV-OP4 may be smaller than a pitch between the fifth bumps DV-OP5. For example, the arrangement interval between bumps in the first bumps DV-OP1 is the smallest, and the arrangement interval between bumps may increase toward a lower row.

In case that the bump placed farthest from the reference line VL is the outermost bump, the distance from the reference line VL to the first outermost bump of the first row R-1 may be shorter than the distance from the reference line VL to the second outermost bump of the second row R-2. The distance from the reference line VL to the second outermost bump of the second row R-2 may be shorter than the distance from the reference line VL to the third outermost bump of the third row R-3. Likewise, the distance from the reference line VL to the third outermost bump of the third row R-3 is shorter than the distance from the reference line VL to the fourth outermost bump of the fourth row R-4, and the distance from the reference line VL to the fourth outermost bump of the fourth row R-4 may be shorter than the distance from the reference line VL to the fifth outermost bump of the fifth row R-5. In other words, the distance between the first to fifth outermost bump and the reference line VL increases as the row number increases. The separation distance from the short side DDV-S3 or DDV-S4 of the driving circuit DDV to the first outermost bump may be longer than the separation distance from the short side DDV-S3 or DDV-S4 to each of the second to fifth outermost bumps.

Similar to the output bump, the input bump DV-IP disposed on the input row R-I may also include a reference input bump placed on the reference line VL, and a first input bumps DV-IP1 disposed relatively to the left and a second input bumps DV-IP2 disposed relatively to the right with respect to the first reference bump.

Any corresponding one of the data lines DL1 to DLn may be electrically connected to a corresponding one of the plurality of bumps DDV-BP. Each of the output bump including first bumps DV-OP1, second bumps DV-OP2, third bumps DV-OP3, fourth bumps DV-OP4, and fifth bumps DV-OP5, which are respectively disposed in the first to the fifth rows R-1, R-2, R-3, R-4, and R-5, and the input bump DV-IP disposed on the input row R-I may be electrically connected to any corresponding one among the data lines DL1 to DLn.

The driving circuit DDV may include a dummy bump DMB disposed in at least one of the first to the fifth rows R-1, R-2, R-3, R-4, R-5, and the input row R-I. The dummy bump DMB may be disposed between the outermost bump and the short side DDV-S3 or DDV-S4 of the driving circuit DDV in at least one row of the plurality of rows R-1, R-2, R-3, R-4, R-5, and R-I. In an embodiment, the dummy bump DMB is disposed in each of the first row R-1, the second row R-2, the third row R-3, and the fourth row R-4. As shown in FIG. 8, at the left with respect to the reference line VL, four dummy bumps DMB may be disposed in the first row R-1, three dummy bumps DMB may be disposed in the second row R-2, two dummy bumps DMB may be disposed in the third row R-3, and one dummy bump DMB may be disposed in the fourth row R-4. However, the number of dummy bumps DMB arranged in each row is not limited thereto.

As the distance from the short sides DDV-S3 or DDV-S4 of the driving circuit DDV to the outermost bump of each of the first to the fifth rows R-1, R-2, R-3, R-4, R-5, and the input row R-I is different, the dummy bump DMB may be disposed to compensate for this. With the dummy bump DMB, the distance from the short sides DDV-S3 or DDV-S4 of the driving circuit DDV to the outermost bump (i.e., the dummy bump DMB disposed at the outermost side) may be substantially the same in the first row R-1 to the fifth row R-5. The dummy bump DMB may protrude by a thickness substantially equal to those of the bumps DDV-BP. In the disclosure, "substantially the same" or "substantially equal" means that the values such as the thickness of each component are the same or within the range including differences that may occur due to errors in the process (despite for example the same design). The dummy bump DMB and the bumps DDV-BP may include the same material and may be formed by the same process. In an embodiment, the thickness of the bumps DDV-BP may be about 7 μm or greater and about 10 μm or less, and the thickness of the dummy bump DMB may be about 7 μm or greater and about 10 μm or less.

The driving circuit DDV may further include alignment marks ALM1 and ALM2 disposed at an end of at least one of the first to the fifth rows R-1, R-2, R-3, R-4, R-5, and the input row R-I. In an embodiment, the alignment marks ALM1 and ALM2 may include a first alignment mark ALM1 disposed at the end of the first row R-1, and a second alignment mark ALM2 disposed at the end of the input row R-I. The first and second alignment marks ALM1 and ALM2 may be disposed adjacent to a side of the driving circuit DDV. In an embodiment, the first and second alignment marks ALM1 and ALM2 may be disposed adjacent to first and second short sides DDV-S3 and DDV-S4 of the driving circuit DDV. As the first and second alignment marks ALM1 and ALM2 are disposed adjacent to the first and second short sides DDV-S3 and DDV-S4 of the driving circuit DDV, the dummy bump DMB may be disposed between the first and second alignment marks ALM1 and ALM2 and the bumps DDV-BP. In an embodiment, the second alignment mark ALM2 may be omitted. The first and second alignment marks ALM1 and ALM2 may be applied as an identification mark for identifying the position of the driving circuit DDV or aligning the driving circuit DDV and the display panel DP in the process of bonding the driving circuit DDV and the display panel DP. In FIG. 8, the first and second alignment marks ALM1 and ALM2 have a cross shape, but the embodiments are not limited thereto. The first and second alignment marks ALM1 and ALM2 may have different shapes as long as they can be used to align the driving circuit DDV.

The driving circuit DDV may further include an alignment test mark ALI overlapping the first and second alignment marks ALM1 and ALM2 in the column direction. The alignment test mark ALI may be applied as an identification mark for determining the position of the driving circuit DDV or whether the alignment of the driving circuit DDV is appropriate in a process of checking the alignment of the driving circuit DDV. There may be multiple alignment test mark ALI. At least one of the alignment test marks ALI may be arranged side by side in at least one row among a plurality of rows R-1, R-2, R-3, R-4, R-5, and R-I in which bumps DDV-BP are arranged. For example, a pair of the alignment test marks ALI may be arranged in parallel to the fifth row R-5.

The driving circuit DDV may further include side bumps SDB disposed adjacent to the short sides DDV-S3 and DDV-S4. The side bumps SDB are disposed adjacent to the short sides DDV-S3 and DDV-S4 of the driving circuit DDV and compensate for a step difference or height different in an area adjacent to the short sides DDV-S3 and DDV-S4 of the driving circuit DDV. Side bumps SDB may be provided and may protrude by a thickness substantially equal to those of the bumps DDV-BP. The side bump SDB and the bumps DDV-BP may include the same material and may be formed by the same process.

The bumps DDV-BP included in the driving circuit DDV according to an embodiment may further include an additional bump disposed in at least one row among the rows in which the output bump and the input bump are disposed, in addition to output bumps and input bumps electrically connected to the data lines DL1 to DLn. At least one of the additional bumps is a crack detection bump. The crack detection bump is electrically connected to the crack detection line CDS (see FIGS. 5A and 5B) among the signal lines of the display panel DP (see FIGS. 5A and 5B), so that defects such as cracks occurring in the peripheral area of the driving circuit DDV may be detected. In an embodiment, the additional bumps may be disposed between output bumps and input bumps disposed in the rows. In an embodiment, the additional bump includes a dummy bump DMB and a side bump SDB, and the dummy bump DMB may be a crack detection bump. However, the embodiments are not limited thereto. For example, the side bump SDB may be a crack detection bump, or the bump formed on the alignment marks ALM1 and ALM2 may be a crack detection bump.

Figure 9:
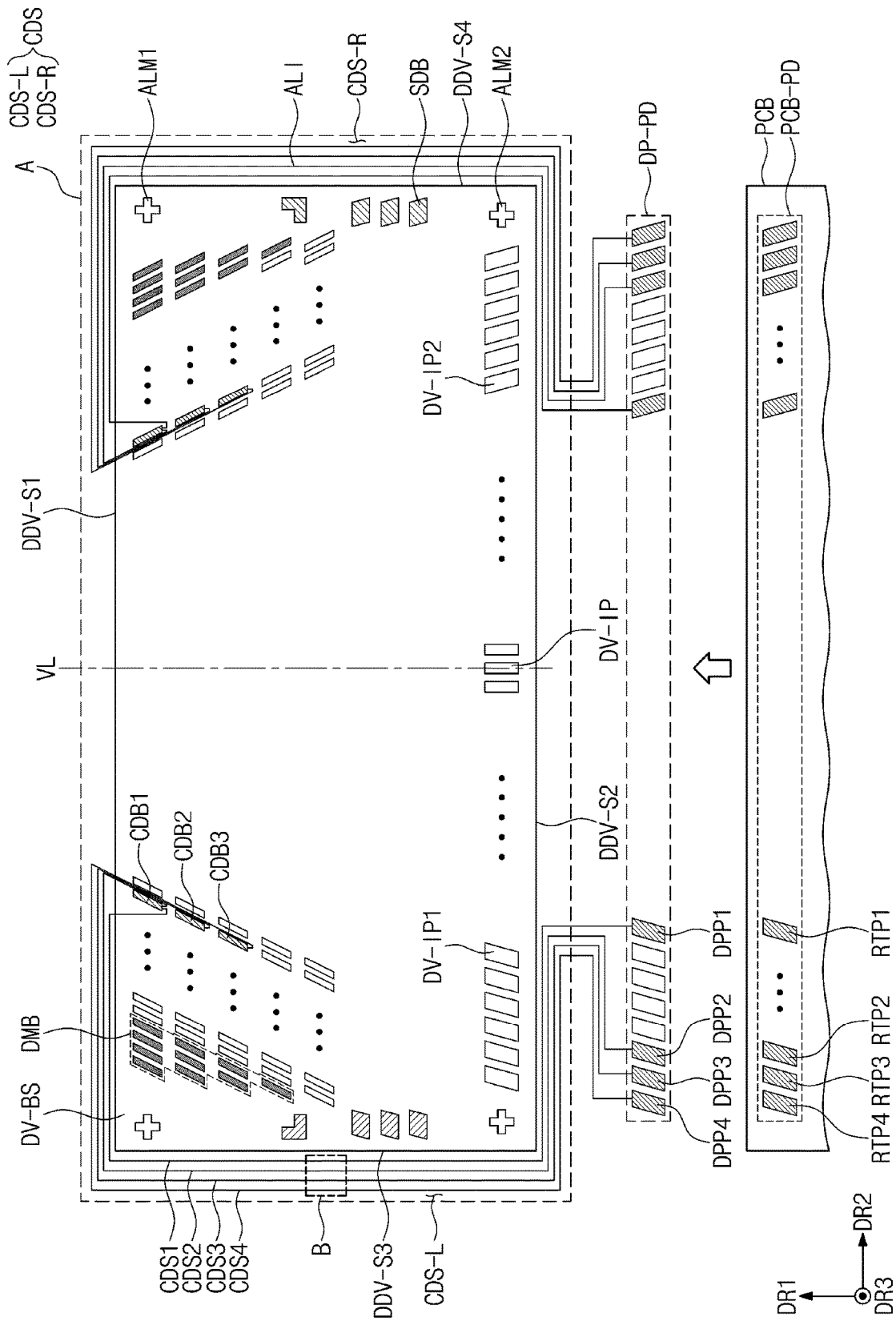
FIG. 9 is a schematic plan view of a partial area of a display device according to an embodiment.
Figure 10:
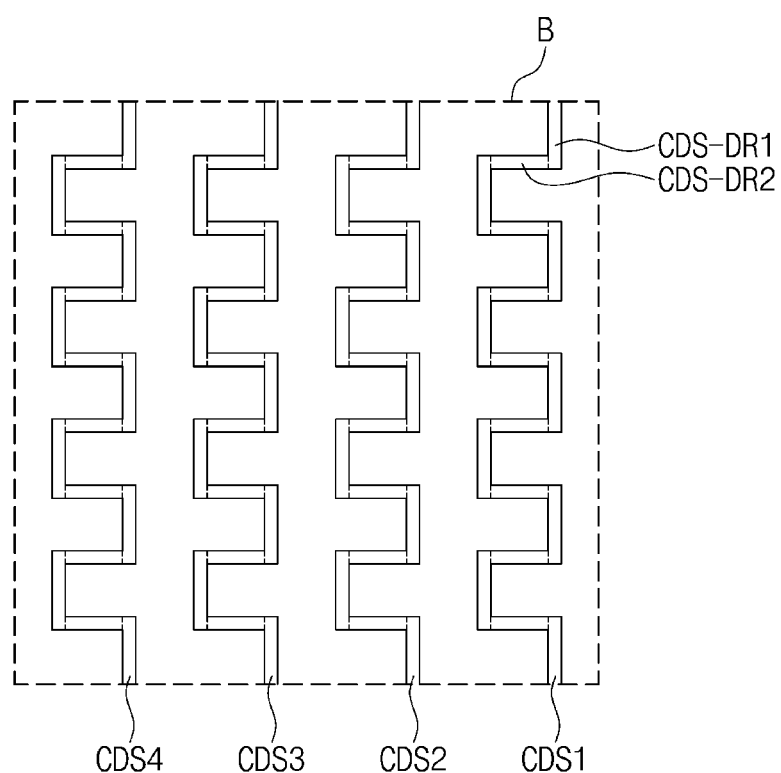
FIG. 10 is an enlarged schematic plan view of a partial area of a display device according to an embodiment.

FIG. 9 is a schematic plan view of a partial area of a display device according to an embodiment. FIG. 10 is an enlarged schematic plan view of a partial area of a display device according to an embodiment. In FIG. 9, area A of FIGS. 5A and 5B and an area in which signal pads are disposed are enlarged and shown. In FIG. 10, area B shown in FIG. 9 is enlarged.

Referring to FIGS. 8 and 9, at least a portion of the crack detection line CDS is disposed adjacent to the edge of the driving circuit DDV. In an embodiment, the crack detection line CDS may be disposed adjacent to short sides DDV-S3 and DDV-S4 of the driving circuit DDV. The crack detection line CDS may include a left crack detection line CDS-L disposed adjacent to the first short side DDV-S3, and a right crack detection line CDS-R disposed adjacent to the second short side DDV-S4. The left crack detection line CDS-L and the right crack detection line CDS-R may have symmetrical shapes with respect to the reference line VL of the driving circuit DDV. Each of the left crack detection line CDS-L and the right crack detection line CDS-R may be disposed adjacent to not only the first short side DDV-S3 or the second short side DDV-S4 of the driving circuit DDV, but also at least a part of the second long sides DDV-S2.

The crack detection line CDS may include detection lines. In an embodiment, the crack detection line CDS may include a first detection line CDS1, a second detection line CDS2, a third detection line CDS3, and a fourth detection line CDS4. In an embodiment, the crack detection line CDS includes a left crack detection line CDS-L and a right crack detection line CDS-R, and each of the left crack detection line CDS-L and the right crack detection line CDS-R may include a first detection line CDS1, a second detection line CDS2, a third detection line CDS3, and a fourth detection line CDS4. FIG.

9 exemplarily shows that each of the left crack detection line CDS-L and the right crack detection line CDS-R includes four detection lines, and the embodiments are not limited thereto. For example, each of the left crack detection line CDS-L and the right crack detection line CDS-R may include two or three detection lines or may include five or more detection lines.

Each of the detection lines included in the crack detection line CDS may have substantially the same wiring length. In an embodiment, each of the first detection line CDS1, the second detection line CDS2, the third detection line CDS3, and the fourth detection line CDS4 included in the crack detection line CDS may have substantially the same wiring length. As each of the detection lines included in the crack detection line CDS has substantially the same wiring length, the difference in resistance due to the wiring length between each detection line can be minimized or reduced. If the lengths of at least any two detection lines of detection lines included in the crack detection line CDS are different, the display device may be provided with a compensation unit capable of applying a weight to compensate for a difference in wiring resistance between detection lines having different lengths.

The crack detection line CDS is electrically connected to crack detection bumps CDB1, CDB2, and CDB3 included in the driving circuit DDV. The crack detection bumps CDB1, CDB2, and CDB3 may be arranged in any one of the rows in which output bumps DV-OP1, DV-OP2, DV-OP3, DV-OP4, and DV-OP5 are arranged. The crack detection bumps CDB1, CDB2, and CDB3 may be disposed between the output bumps DV-OP1, DV-OP2, DV-OP3, DV-OP4, and DV-OP5. The crack detection bumps CDB1, CDB2, and CDB3 may include a first crack detection bump CDB1, a second crack detection bump CDB2, and a third crack detection bump CDB3. A first detection line CDS1 and a second detection line CDS2 may be electrically connected to the first crack detection bump CDB1. A third detection line CDS3 may be electrically connected to the second crack detection bump CDB2. A fourth detection line CDS4 may be electrically connected to the third crack detection bump CDB3. However, the embodiments are not limited thereto. For example, two or more crack detection bumps CDB1, CDB2, and CDB3 can be provided, and the connection relation between the crack detection line and the crack detection bump can be provided in various ways.

The crack detection line CDS according to an embodiment may be electrically connected to at least a part of the signal pads DP-PD so as to be electrically connected to the circuit board PCB. As the crack detection line CDS is electrically connected to the signal pads DP-PD and the signal pads DP-PD and the circuit board pads PCB-PD are electrically connected, the crack detection line CDS may be electrically connected to the circuit board pads PCB-PD.

The circuit board PCB may include circuit board pads PCB-PD, and the circuit board pads PCB-PD may include resistance test pads RTP1, RTP2, RTP3, and RTP4. The resistance test pads RTP1, RTP2, RTP3, and RTP4 are electrically connected to the test signal pads DPP1, DPP2, DPP3, and DPP4 among the signal pads DP-PD of the display panel, and the crack detection line CDS may be electrically connected to the test signal pads DPP1, DPP2, DPP3, and DPP4. Through this, the crack detection line CDS may be electrically connected to the resistance test pads RTP1, RTP2, RTP3, and RTP4.

The resistance test pads RTP1, RTP2, RTP3 and RTP4 may include a first resistance test pad RTP1, a second resistance test pad RTP2, a third resistance test pad RTP3, and a fourth resistance test pad RTP4. The test signal pads DPP1, DPP2, DPP3, and DPP4 may include a first test signal pad DPP1, a second test signal pad DPP2, a third test signal pad DPP3, and a fourth test signal pad DPP4 that respectively correspond to the first resistance test pad RTP1, the second resistance test pad RTP2, the third resistance test pad RTP3, and the fourth resistance test pad RTP4. A predetermined voltage and/or a predetermined current may be provided to each of the first resistance test pad RTP1, the second resistance test pad RTP2, the third resistance test pad RTP3, and the fourth resistance test pad RTP4, and it is possible to test whether a crack has occurred in the area overlapping the crack detection line CDS by testing the resistances of the crack detection line CDS electrically connected to each of the first resistance test pad RTP1, the second resistance test pad RTP2, the third resistance test pad RTP3, and the fourth resistance test pad RTP4. In an embodiment, the first resistance test pad RTP1 may be electrically connected to the first detection line CDS1, and a constant voltage or a constant current may be provided to the first resistance test pad RTP1. The second resistance test pad RTP2 may be electrically connected to the second detection line CDS2, and a constant voltage or a constant current may be provided to the second resistance test pad RTP2. The third resistance test pad RTP3 may be electrically connected to the third detection line CDS3, and a constant voltage or a constant current may be provided to the third resistance test pad RTP3. The fourth resistance test pad RTP4 may be electrically connected to the fourth detection line CDS4, and a constant voltage or a constant current may be provided to the fourth resistance test pad RTP4. Although not shown in the drawing, the circuit board PCB may further include a constant voltage source and a constant current source for providing a constant voltage and a constant current to the first to the fourth resistance test pads RTP1, RTP2, RTP3, and RTP4.

The display device according to an embodiment includes a crack detection line CDS disposed adjacent to at least a portion of an edge of the driving circuit DDV. The crack detection line CDS is electrically connected to the first to the third crack detection bumps CDB1, CDB2, and CDB3 included in the driving circuit DDV and the first to the fourth resistance test pads RTP1, RTP2, RTP3, and RTP4 included in the circuit board PCB, so that it is determined whether defects such as cracks have occurred in the area adjacent to the edge of the driving circuit DDV through the resistance test. Through this, when a defect such as a crack has occurred in the display panel due to the pressure generated in the process of compressing the display panel and the driving circuit DDV, a defect is detected by the crack detection line CDS, so that a display device with improved reliability can be provided.

More specifically, in the case of a conventional display panel including a flexible base layer, the display panel is easy to bend or crack in the process of compressing the display panel and the driving circuit, but cracks in the area adjacent to the edge of the driving circuit are not found by signal lines electrically connected to bumps located inside the driving circuit, so that it was difficult to find cracks generated by the pressing process, and the cracks generated in the pressing process was progressed, and thus driving failure could occur. However, in an embodiment, cracks generated by the crack detection line CDS arranged in a display panel area, that is, the area adjacent to the edge of the driving circuit DDV, where cracks are likely to occur in the pressing process can be detected, so that cracks generated around the driving circuit of the display panel can be easily detected, and thus reliability of the display device can be improved.

Referring to FIG. 10, each of a first detection line CDS1, a second detection line CDS2, a third detection line CDS3, and a fourth detection line CDS4 according to an embodiment may have a zigzag shape. More specifically, each of the first detection line CDS1, the second detection line CDS2, the third detection line CDS3, and the fourth detection line CDS4 may have a zigzag shape in which a vertically extending detection line CDS-DR1 and a horizontally extending detection line CDS-DR2 are alternately provided. As each of the first detection line CDS1, the second detection line CDS2, the third detection line CDS3, and the fourth detection line CDS4 has a zigzag shape, cracks generated around the driving circuit of the display panel can be more easily detected, and each of the first detection line CDS1, the second detection line CDS2, the third detection line CDS3, and the fourth detection line CDS4 may be easily designed to have the same wiring length.

Figure 11A:
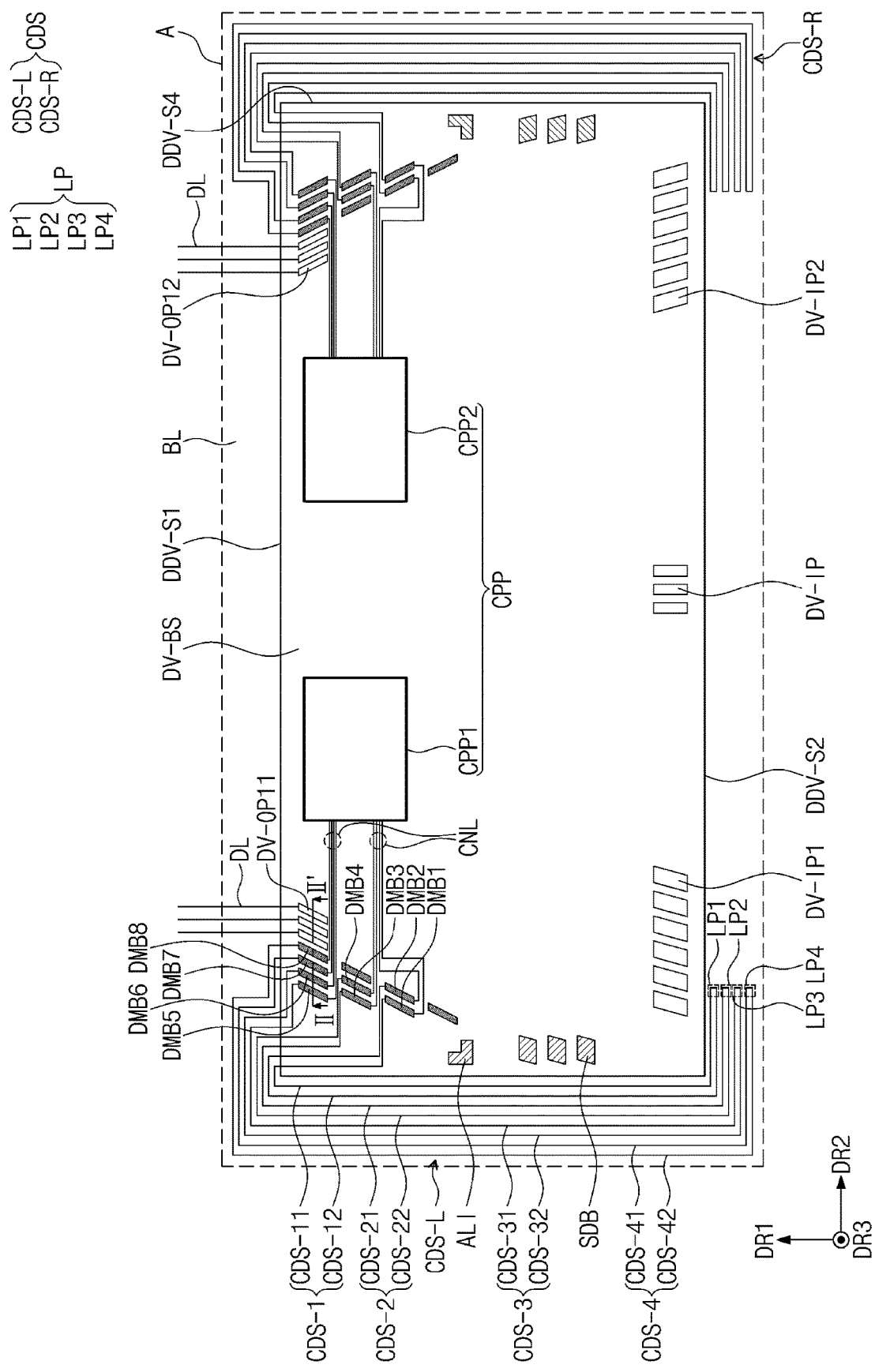
FIG. 11A is a schematic plan view of a partial area of a display device according to an embodiment.
Figure 11B:
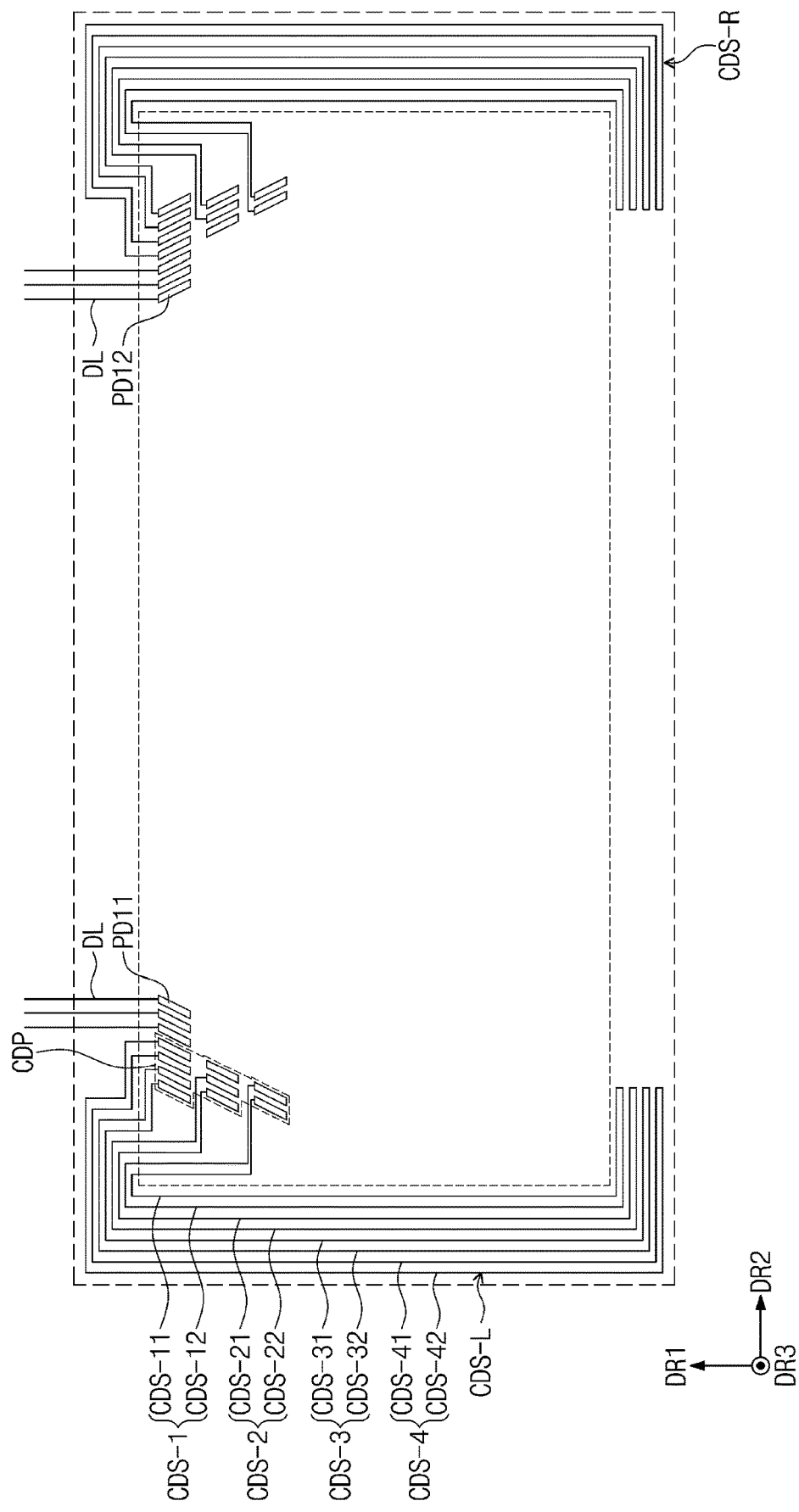
FIG. 11B is a schematic plan view illustrating only a partial configuration in a partial area of a display device according to an embodiment.
Figure 11C:
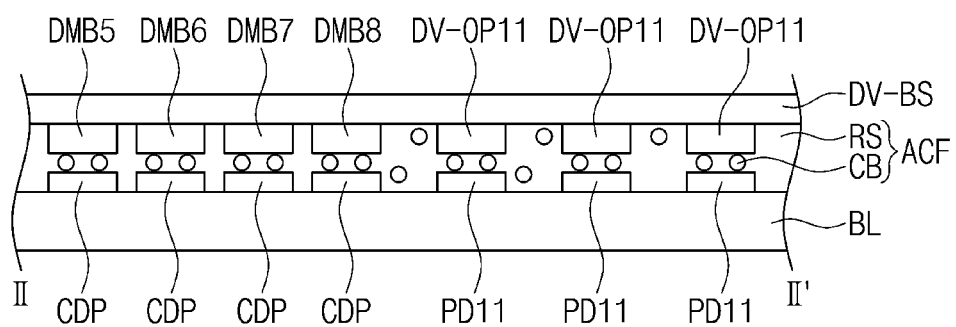
FIG. 11C is a schematic cross-sectional view of a partial area of a display device according to an embodiment.

FIG. 11A is a schematic plan view of a partial area of a display device according to another embodiment. FIG. 11B is a schematic plan view illustrating only a partial configuration in a partial area of a display device according to another embodiment. FIG. 11C is a schematic cross-sectional view of a partial area of a display device according to another embodiment. In FIG. 11A, area A of FIGS. 5A and 5B is enlarged. FIG. 11B mainly illustrates the configuration of the crack detection line CDS in area A of FIGS. 5A and 5B shown in FIG. 11A excluding the driving circuit DDV. In FIG. 11C, a schematic cross-section corresponding to the line II-II' of FIG. 11A is shown. Hereinafter, in describing the configuration of the driving circuit DDV and the crack detection line CDS of a display device according to an embodiment with reference to FIGS. 11A to 11C, the same reference numerals are assigned to the same components as those described above, and repetitive descriptions are omitted. In FIGS. 11A to 11C, it is exemplarily illustrated that the dummy bump DMB is a crack detection bump electrically connected to the crack detection line CDS, and the dummy bump DMB is referred to as a crack detection bump. However, the embodiments are not limited to the configurations shown in FIGS. 11A to 11C. For example, the crack detection bump may be the side bump SDB rather than the dummy bump DMB, or a bump disposed between the output bumps as shown in FIG. 9.

Referring to FIGS. 8 and 11A, the crack detection line CDS is electrically connected to a dummy bump DMB, for example, the crack detection bump DMB, included in the driving circuit DDV. At least part of the crack detection line CDS is disposed adjacent to the edge of the driving circuit DDV. In an embodiment, the crack detection line CDS may be disposed adjacent to the first and second short sides DDV-S3 and DDV-S4 of the driving circuit DDV. The crack detection line CDS may include a left crack detection line CDS-L disposed adjacent to the first short side DDV-S3, and a right crack detection line CDS-R disposed adjacent to the second short side DDV-S4. The left crack detection line CDS-L and the right crack detection line CDS-R may have symmetrical shapes with respect to the reference line VL of the driving circuit DDV. Each of the left crack detection line CDS-L and the right crack detection line CDS-R may be disposed adjacent to not only the first short side DDV-S3 or the second short side DDV-S4 of the driving circuit DDV, but also at least a part of the second long sides DDV-S2.

The crack detection line CDS may include detection lines. In an embodiment, the crack detection line CDS may include a first detection line CDS-1, a second detection line CDS-2, a third detection line CDS-3, and a fourth detection line CDS-4. In an embodiment, the crack detection line CDS includes a left crack detection line CDS-L and a right crack detection line CDS-R, and each of the left crack detection line CDS-L and the right crack detection line CDS-R may include a first detection line CDS-1, a second detection line CDS-2, a third detection line CDS-3, and a fourth detection line CDS-4. FIG. 11A exemplarily shows that each of the left crack detection line CDS-L and the right crack detection line CDS-R includes four detection lines, and the embodiments are not limited thereto. For example, each of the left crack detection line CDS-L and the right crack detection line CDS-R may include two or three detection lines or may include five or more detection lines.

The crack detection line CDS may include a structure reciprocating or forming a loop structure through detection lines extending along an edge of the driving circuit DDV. In an embodiment, each of the first detection line CDS-1, the second detection line CDS-2, the third detection line CDS-3, and the fourth detection line CDS-4 included in the crack detection line CDS may include two detection lines, for example, an input detection line and an output detection line, and may have a loop structure in which the input detection line and the output detection line are electrically connected and reciprocated (or forming a loop structure). The input detection line and output detection line are spaced apart from the driving circuit. For example, the output detection line is disposed between the input detection line and the driving circuit. The first detection line CDS-1 may include a first input detection line CDS-11 and a first output detection line CDS-12 and may include a first loop LP1 in which the first input detection line CDS-11 and the first output detection line CDS-12 are connected to each other to reciprocate. The second detection line CDS-2 may include a second input detection line CDS-21 and a second output detection line CDS-22 and may include a second loop LP2 in which the second input detection line CDS-21 and the second output detection line CDS-22 are connected to each other to reciprocate. The third detection line CDS-3 may include a third input detection line CDS-31 and a third output detection line CDS-32 and may include a third loop LP3 in which the third input detection line CDS-31 and the third output detection line CDS-32 are connected to each other to reciprocate. The fourth detection line CDS-4 may include a fourth input detection line CDS-41 and a fourth output detection line CDS-42 and may include a fourth loop LP4 in which the fourth input detection line CDS-41 and the fourth output detection line CDS-42 are connected to each other to reciprocate. In FIG. 11A, each detection line reciprocates once with a structure of a single loop LP, but the embodiments are not limited thereto. For example, each detection line may have multiple loops LP and may reciprocate multiple times.

The driving circuit DDV according to an embodiment may further include a comparison unit CPP disposed on the driving chip DV-BS. The comparison unit CPP may be electrically connected to the crack detection bump DMB through a connection line CNL. In an embodiment, multiple comparison units CPP may be provided. The comparison unit CPP may include a first comparison unit CPP1 connected to the left crack detection bump DMB electrically connected to the left crack detection line CDS-L through the connection line CNL and a second comparison unit CPP2 connected to the right crack detection bump DMB electrically connected to the right crack detection line CDS-R through the connection line CNL. However, the embodiments are not limited thereto. For example, the comparison unit CPP may be provided with only one comparison unit or may be provided with three or more comparison units. The comparison unit CPP may comprise any of various available processors to execute instructions thereof.

The comparison unit CPP may determine an output signal detected through the crack detection line CDS and output a result. The comparison unit CPP may compare output signals provided from detection lines included in the crack detection line CDS to determine whether a crack has occurred. The comparison unit CPP may compare the output signal from the left crack detection line CDS-L and the output signal from the right crack detection line CDS-R to determine whether a crack has occurred. In an embodiment, a wiring resistance of at least one among the detection lines included in the crack detection line CDS is set as a reference resistance for comparing with the wiring resistance of other detection lines, and the comparison unit CPP may detect a resistance calculated with output signals provided from the detection lines and compare the detected resistance with a reference resistance to determine whether a crack has occurred.

Each of the detection lines included in the crack detection line CDS may have substantially the same wiring length. In an embodiment, each of the first detection line CDS-1, the second detection line CDS-2, the third detection line CDS-3, and the fourth detection line CDS-4 included in the crack detection line CDS may have substantially the same wiring length. As each of the detection lines included in the crack detection line CDS has substantially the same wiring length, the difference in resistance due to the wiring length between each detection line can be minimized or reduced. If the lengths of at least any two detection lines of the detection lines included in the crack detection line CDS are different, the comparison unit CPP may determine whether a crack has occurred after applying a weight to compensate for a difference in wiring resistance between detection lines having different lengths. In an embodiment, if the lengths of the first detection line CDS-1 and the second detection line CDS-2 are different from each other, the comparison unit CPP may determine whether a crack has occurred after applying a weight to compensate for a difference in wiring resistance between the first detection line CDS-1 and the second detection line CDS-2.

Multiple crack detection bumps DMB may be provided to be electrically connected to the detection lines, respectively. In an embodiment, the crack detection bump DMB may include a first crack detection bump DMB1 and a second crack detection bump DMB2 electrically connected to the first detection line CDS-1, a third crack detection bump DMB3 and a fourth crack detection bump DMB4 electrically connected to the second detection line CDS-2, a fifth crack detection bump DMB5 and a sixth crack detection bump DMB6 electrically connected to the third detection line CDS-3, and a seventh crack detection bump DMB7 and an eighth crack detection bump DMB8 electrically connected to the fourth detection line CDS-4. A first input detection line CDS-11 may be electrically connected to the first crack detection bump DMB1, a first output detection line CDS-12 may be electrically connected to the second crack detection bump DMB2, a second input detection line CDS-21 may be electrically connected to the third crack detection bump DMB3, a second output detection line CDS-22 may be electrically connected to the fourth crack detection bump DMB4, a third input detection line CDS-31 may be electrically connected to the fifth crack detection bump DMB5, a third output detection line CDS-32 may be electrically connected to the sixth crack detection bump DMB6, a fourth input detection line CDS-41 may be electrically connected to the seventh crack detection bump DMB7, and a fourth output detection line CDS-42 may be electrically connected to the eighth crack detection bump DMB8.

Referring to FIGS. 8 and 11A to 11C, the display panel DP (see FIGS. 5A and 5B) further includes a crack detection pad CDP electrically connected to an end of the crack detection line CDS disposed on the base layer BL. The display panel DP may be electrically connected to a crack detection bump DMB of the driving circuit DDV through the crack detection pad CDP. The crack detection bump DMB may be arranged to correspond one-to-one with the crack detection pad CDP electrically connected to the crack detection line CDS. The display panel DP may include a pad disposed to correspond to each corresponding bump among the bumps of the driving circuit DDV, and a data line DL electrically connected to the pad. In an embodiment, as shown in FIG. 11C, crack detection pads CDP may be disposed on the base layer BL of the display panel DP to respectively correspond to the fifth crack detection bump DMB5, the sixth crack detection bump DMB6, the seventh crack detection bump DMB7, and the eighth crack detection bump DMB8, and first pads PD11 may be disposed to respectively correspond to the 1-1-th bumps DV-OP11. Second pads PD12 may be disposed to respectively correspond to the 1-2-th bumps DV-OP12. An anisotropic conductive film ACF may be disposed and attached between the crack detection bump DMB and the crack detection pad CDP, and the crack detection bump DMB and the crack detection pad CDP may be electrically connected by conductive particles CB included in the anisotropic conductive film ACF.

Figure 12A:
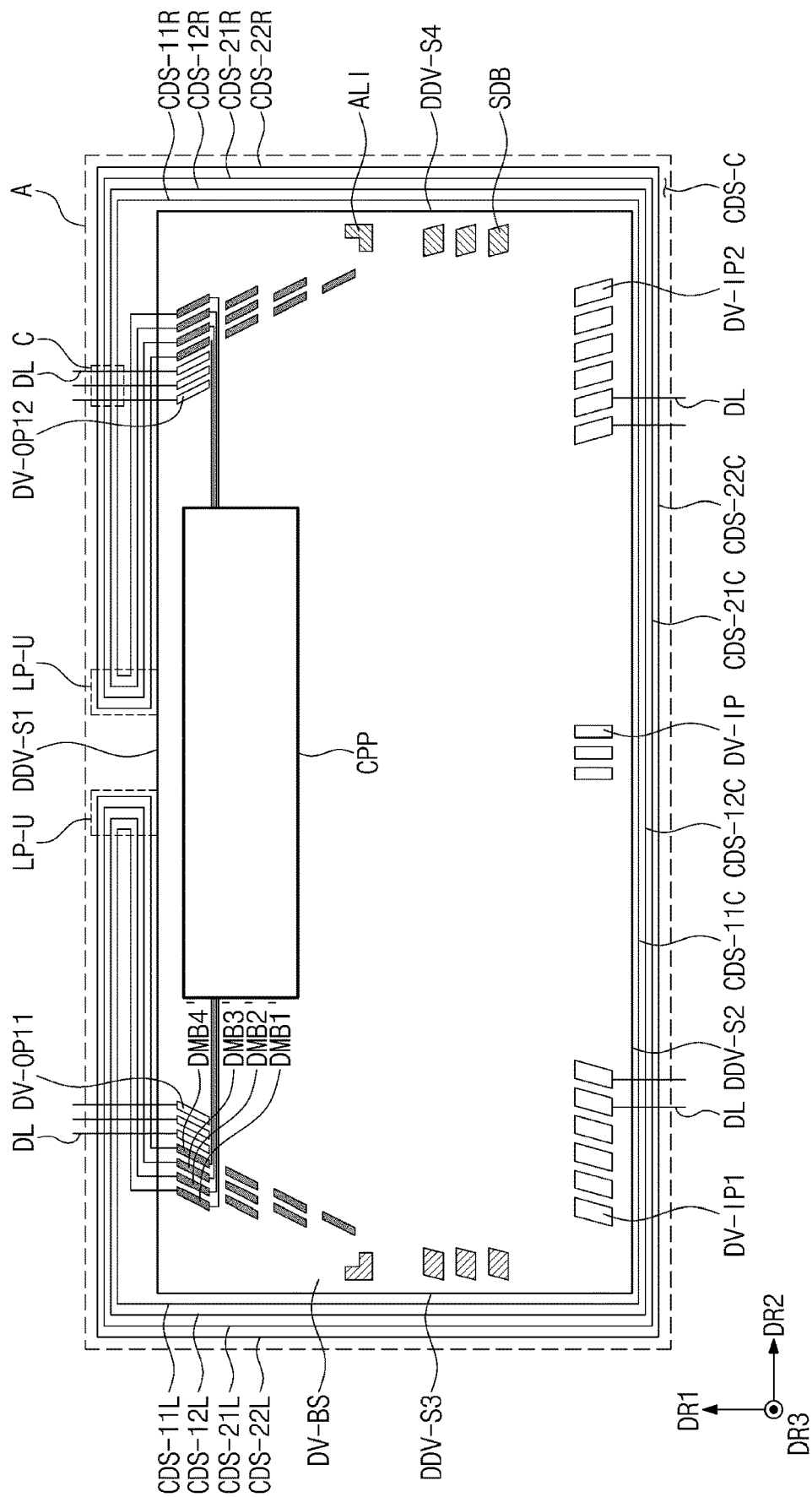
FIG. 12A is a schematic plan view of a partial area of a display device according to an embodiment.
Figure 12B:
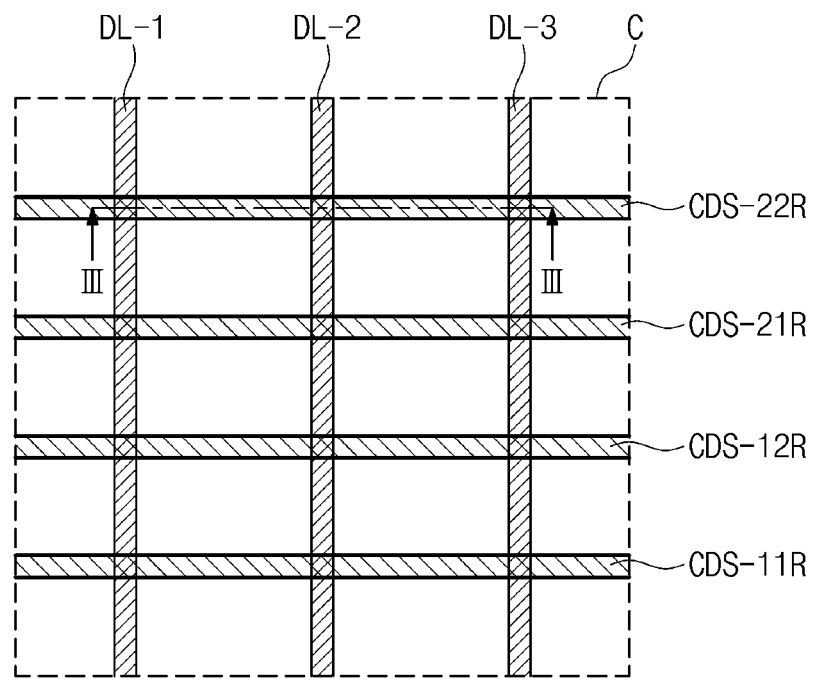
FIG. 12B is a schematic enlarged plan view of a partial area of a display device according to an embodiment.
Figure 12C:
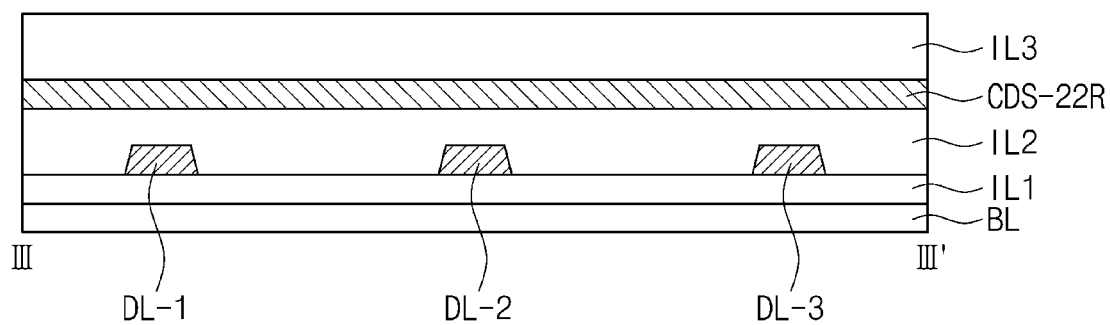
FIG. 12C is a schematic cross-sectional view of a partial area of a display device according to an embodiment.

FIG. 12A is a schematic plan view of a partial area of a display device according to another embodiment. FIG. 12B is an enlarged schematic plan view of a partial area of a display device according to an embodiment. FIG. 12C is a schematic cross-sectional view of a partial area of a display device according to an embodiment. In FIG. 12A, area A of FIGS. 5A and 5B is enlarged. In FIG. 12B, area C of FIG. 12A is enlarged. In FIG. 12C, a cross-section corresponding to the line III-III' of FIG. 12B is shown. Hereinafter, in describing the configuration of the driving circuit DDV and the crack detection line CDS of a display device according to an embodiment with reference to FIGS. 12A to 12C, the same reference numerals are assigned to the same components as those described with reference to FIGS. 11A to 11C, and repetitive descriptions are omitted.

Referring to FIGS. 8 and 12A, the crack detection line CDS may be disposed along the edge of the driving circuit DDV. The crack detection line CDS may be disposed adjacent to the first and second short sides DDV-S3 and DDV-S4 of the driving circuit DDV and may be disposed adjacent to at least a portion of the first and second long sides DDV-S1 and DDV-S2 of the driving circuit DDV. The crack detection line CDS may be disposed adjacent to the second long side DDV-S2. The crack detection line CDS may include a first detection line CDS-1 electrically connected to a first crack detection bump DMB1' and a second crack detection bump DMB2', and a second detection line CDS-2 electrically connected to a third crack detection bump DMB3' and a fourth crack detection bump DMB4'. Each of the first detection line CDS-1 and the second detection line CDS-2 may be disposed adjacent to a first short side DDV-S3, a second short side DDV-S4, and a second long side DDV-S2 after reciprocating through a structure of an upper loop LP-U adjacent to a first long side DDV-S1. The first detection line CDS-1 may include a first input detection line CDS-11 electrically connected to the first crack detection bump DMB1' and a first output detection line CDS-12 electrically connected to the second crack detection bump DMB2', and the second detection line CDS-2 may include a second input detection line CDS-21 electrically connected to the third crack detection bump DMB3' and a second output detection line CDS-22 electrically connected to the fourth crack detection bump DMB4'. The first input detection line CDS-11 may include a left first input detection line CDS-11L and a right first input detection line CDS-11R. The first output detection line CDS-12 may include a left first output detection line CDS-12L and a right first output detection line CDS-12R. The second input detection line CDS-21 may include a left second input detection line CDS-21L and a right second input detection line CDS-21R. The second output detection line CDS-22 may include a left second output detection line CDS-22L and a right second output detection line CDS-22R.

The crack detection line CDS may include a left crack detection line CDS-L disposed adjacent to the first short side DDV-S3 of the driving circuit DDV, and a right crack detection line CDS-R disposed adjacent to the second short side DDV-S4. The left crack detection line CDS-L and the right crack detection line CDS-R may be electrically connected to each other. The crack detection line CDS includes a connection crack detection line CDS-C electrically connecting the left crack detection line CDS-L and the right crack detection line CDS-R, and the connection crack detection line CDS-C may be disposed adjacent to the second long side DDV-S2. The crack detection line CDS of an embodiment includes a connection crack detection line CDS-C electrically connecting the left crack detection line CDS-L and the right crack detection line CDS-R. As the crack detection line CDS forms a reciprocating structure including a structure of the upper loop LP-U at the upper part of the driving circuit DDV, the crack detection line CDS may be disposed adjacent to the entire edge of the driving circuit DDV. Accordingly, in an area adjacent to the entire edge of the driving circuit DDV, it is possible to easily detect whether a crack has occurred in the display panel.

Referring to FIGS. 12A to 12C, as the crack detection line CDS of an embodiment is disposed adjacent to the entire edge of the driving circuit DDV, portions of the crack detection line CDS electrically connected to the crack detection bump DMB and the data line DL connected to the bump DDV-BP may overlap in a plan view. In an embodiment, each of the first data line DL-1, the second data line DL-2, and the third data line DL-3 may overlap each of the first input detection line CDS-11R, the first output detection line CDS-12R, the second input detection line CDS-21R, and the second output detection line CDS-22R in a plan view.

The crack detection line CDS and the data line DL may be disposed on different layers. In an embodiment, insulating layers IL1, IL2, and IL3 are disposed on the base layer BL of the display panel, and the crack detection line CDS and the data line DL may be disposed on different insulating layers IL1, IL2, and IL3. In an embodiment, the data line DL may be disposed on the first insulating layer IL1, and the crack detection line CDS may be disposed on the second insulating layer IL2. In FIG. 12C, a shape in which the second output detection line CDS-22R is disposed on the second insulating layer IL2 and overlapped by the third insulating layer IL3 is illustrated as an example but the embodiments are not limited thereto. For example, all of the first input detection line CDS-11R, the first output detection line CDS-12R, and the second input detection line CDS-21R may be disposed on the second insulating layer IL2. The data lines DL and the crack detection lines CDS electrically connected to the output bumps of the output row are arranged on different layers, and the data lines DL and the crack detection lines CDS electrically connected to the input bumps of the input row may also be disposed on different layers. As the crack detection line CDS of an embodiment is disposed on a different layer from the data line DL, the crack detection line CDS may be disposed along the entire edge of the driving circuit DDV without interference between signal lines.

Figure 13:
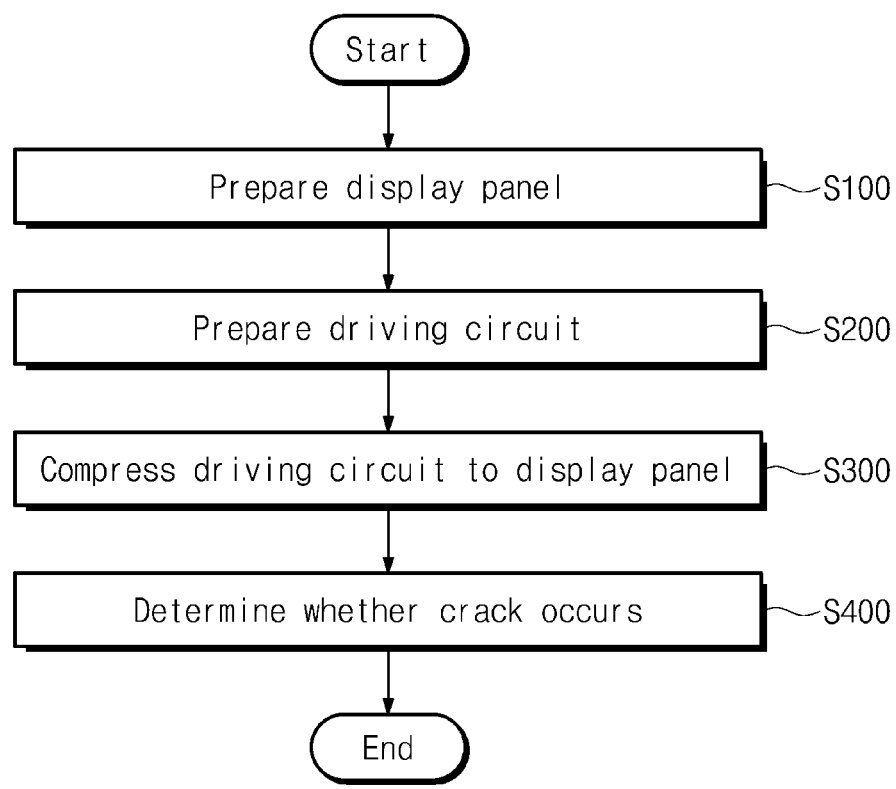
FIG. 13 is a flowchart illustrating a method of manufacturing a display device according to an embodiment.
Figure 14:
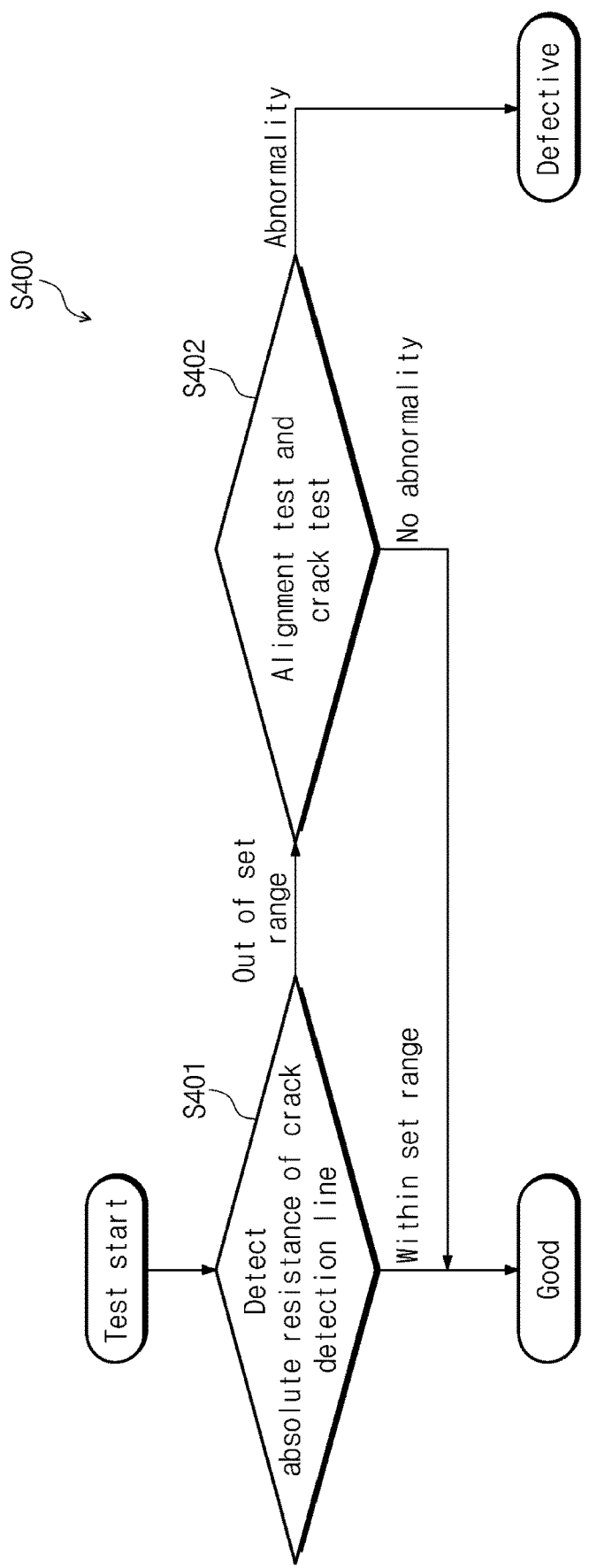
FIGS. 14 and 15 are flowcharts illustrating some operations in a method of manufacturing a display device according to an embodiment.
Figure 15:
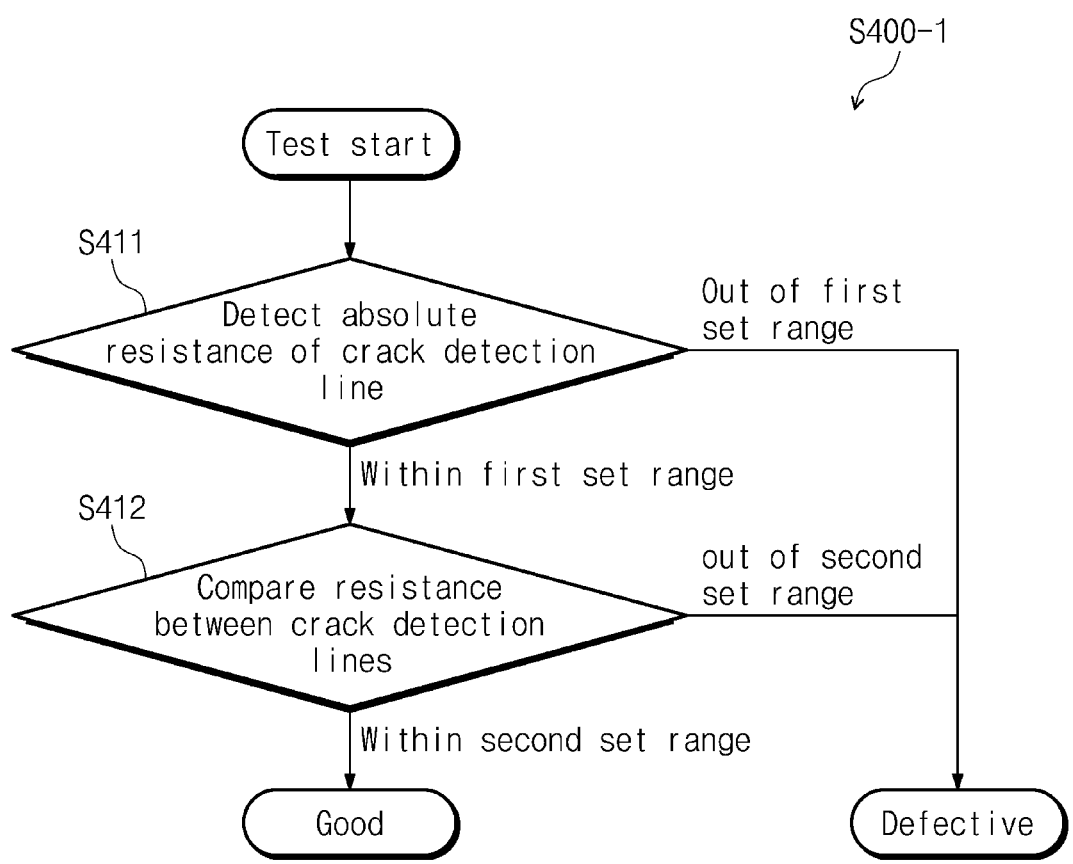

FIG. 13 is a flowchart illustrating a method of manufacturing a display device according to an embodiment. FIGS. 14 and 15 are flowcharts illustrating some operations in a method of manufacturing a display device according to an embodiment. FIGS. 14 and 15 are flowcharts illustrating operations of determining whether a crack has occurred in a method of manufacturing a display device. Hereinafter, a method of manufacturing a display device according to an embodiment will be described with reference to the display device described above and the flowcharts of FIGS. 13 to 15.

Referring to FIGS. 5A, 8, 9, 11A, and 13, a method of manufacturing a display device according to an embodiment includes preparing a display panel DP including a crack detection line CDS (S100), preparing a driving circuit DDV (S200), compressing the driving circuit DDV to the display panel DP so that at least some of the edges of the driving circuit DDV are adjacent to the crack detection line CDS (S300), and determining whether a crack has occurred by measuring the resistance of the crack detection line CDS (S400).

The display panel DP includes the crack detection line CDS disposed in the non-display area NDA. The driving circuit DDV includes a first and a second long sides DDV-S1 and DDV-S2 and a first and a second short sides DDV-S3 and DDV-S4, and in operation S300 of compressing the driving circuit DDV to the display panel DP, at least one of the first and second short sides DDV-S3 and DDV-S4 of the driving circuit DDV may be compressed to be disposed adjacent to the crack detection line CDS. In an embodiment, an anisotropic conductive film ACF is disposed between the display panel DP and the driving circuit DDV, and after the pressing process, the display panel DP and the driving circuit DDV may be attached by the anisotropic conductive film ACF. In an embodiment, the crack detection pad CDP (see FIG. 111B) is disposed at the end of the crack detection line CDS included in the display panel DP, and the crack detection bump DMB included in the driving circuit DDV and the crack detection pad CDP may be compressed to be electrically connected by the anisotropic conductive film ACF. The crack detection line CDS determines whether a crack has occurred in an adjacent area of the driving circuit DDV in the compressing process S300. In an embodiment, the circuit board PCB includes a first to a fourth resistance test pads RTP1, RTP2, RTP3, and RTP4, and the first to the fourth resistance test pads RTP1, RTP2, RTP3, and RTP4 are electrically connected to the crack detection line CDS to measure the resistance value of the crack detection line CDS, so that it is possible to determine whether a crack occurs in a peripheral area where the crack detection line CDS is arranged. In an embodiment, the driving circuit DDV includes a comparison unit CPP, and the comparison unit CPP is electrically connected to the crack detection line CDS to measure the resistance value of the crack detection line CDS, so that it is possible to determine whether a crack has occurred in a peripheral area where the crack detection line CDS is arranged.

With regard to operation S400 of determining whether a crack has occurred with reference to FIGS. 9 and 14, the determining whether the crack has occurred (S400) may include a first operation S401 of determining whether the absolute resistance of the crack detection line CDS is within a set range, and a second operation S402 of testing whether an alignment and a crack have occurred.

In the first operation S401, the first to the fourth resistance test pads RTP1, RTP2, RTP3, and RTP4 (see, e.g., FIG. 9) electrically connected to the crack detection line CDS may measure the resistance values of the detection lines included in the crack detection line CDS and may compare them with a preset absolute resistance value. The set range, which is the difference between the absolute resistance value and the measured resistance value, may be, for example, about ±20% or about ±15%. In case that it is determined that the resistance values measured in the detection lines are within the set range from the absolute resistance value, the first to the fourth resistance test pads RTP1, RTP2, RTP3, and RTP4 may determine that there is a normal wiring state within the process distribution range and the device is in good condition, and in case that the resistance value measured on the detection lines is outside the set range from the absolute resistance value, the process may proceed to the second operation (S402). If it is determined to be in good condition in the first operation S401, the second operation S402 may not be performed.

In the second operation S402, for devices whose resistance value difference is determined to be greater than or equal to the set range in the first operation S401, it may be determined whether there is an alignment error of the driving circuit DDV and whether a crack has occurred in an area around the driving circuit DDV through naked eyes or an observation device. In case that no alignment error or crack occurrence error is detected in the second operation S402, it may be determined as good, and in case that an alignment error or a crack occurrence error is detected, it may be determined as defective. In a method of manufacturing a display device according to an embodiment, before determining whether a crack has occurred through the naked eye, and the like, it is possible to first determine whether there is an abnormality by measuring the resistance value of the crack detection line CDS, so that defects can be readily detected.

Looking at operation S400-1 of determining whether a crack has occurred with reference to FIGS. 11A and 15, the determining whether the crack has occurred in operation S400-1 may include a first operation S411 of determining whether the difference between the resistance of the crack detection line CDS and the absolute resistance value is within a first set range and a second operation S412 of comparing resistances between the detection lines in the crack detection line CDS to determine whether a difference in resistance values is within a second set range.

In the first operation S411, the comparison unit CPP may measure resistance values of the detection lines included in the crack detection line CDS may and compare them with a preset absolute resistance value. The first set range, which is the difference between the absolute resistance value and the measured resistance value, may be, for example, about ±20% or about ±15%. In case that it is determined that the resistance values measured in the detection lines are within the first set range from the absolute resistance value, the comparison unit CPP may determine that there is a normal wiring state within the process distribution range and this is in good condition, and in case that the resistance value measured on the detection lines is outside the first set range from the absolute resistance value, it may be determined as defective. If it is determined to be defective in the first operation S411, the second operation S412 may not be performed.

If it is determined to be good condition in the first operation S411, in the second operation S412, the comparison unit CPP may compare the measured resistance values to the detection lines and determine whether the comparison value of the resistance values is within the second set range. More specifically, as in an embodiment, in case that the crack detection line CDS includes a first detection line CDS-1 and a second detection line CDS-2, the comparison unit CPP compares the resistance value measured from the first detection line CDS-1 with the resistance value measured from the second detection line CDS-2, and determines whether the difference between the resistance value is within the second set range. The second set range, which is the difference in resistance between detection lines, may be, for example, about ±15% or about ±10%. In case that it is determined that the difference between the resistance values measured in the plurality of detection lines is within the second set range, the comparison unit CPP may determine that there is a normal wiring state in which no crack (or fine crack) has occurred and the device is in good condition, and in case that the difference between the resistance values measured in the detection lines is outside the second set range, it may be determined as defective in which a crack or the like has occurred.

The method of manufacturing a display device according to an embodiment includes compressing the driving circuit DDV and the display panel DP such that the crack detection line CDS is disposed adjacent to at least a portion of the edge of the driving circuit DDV and then, determining whether a defect such as a crack occurs in an area adjacent to the edge of the driving circuit DDV through the first to the fourth resistance test pads RTP1, RTP2, RTP3, RTP4 electrically connected to the crack detection line CDS or the comparison unit CPP. Through this, in case that a defect such as a crack has occurred in the display panel DP due to the pressure generated in the process of compressing the display panel DP and the driving circuit DDV, the defect can be readily detected by the crack detection line CDS, and a display device with improved reliability can be provided through the display device manufacturing method of an embodiment.

According to an embodiment, a crack detection line may be disposed adjacent to at least a portion of an edge of the driving circuit, and accordingly, cracks generated in the process of bonding the driving circuit and the display panel can be detected by the crack detection line, so that reliability of the display device can be improved.

Although some embodiments have been described, it is understood that the disclosure should not be limited to these embodiments but various changes and modifications can be made by one ordinary skilled in the art within the spirit and scope of the disclosure.

What is claimed is:

1. A display device comprising:
a display panel including:
a display area displaying an image;
a non-display area adjacent to the display area; and
a plurality of signal lines; and
a module crack detection line disposed in the non-display area and at an outermost side of the display panel; and
a driving circuit disposed in the non-display area, wherein the driving circuit comprises a plurality of bumps arranged in a plurality of rows, the plurality of bumps comprise a crack detection bump arranged in at least one row among the plurality of rows, the plurality of signal lines comprise a crack detection line, the crack detection line electrically connected to the crack detection bump, and at least a portion of the crack detection line is disposed adjacent to an edge of the driving circuit.

2. The display device of claim 1, wherein
the driving circuit comprises:
at least one long side extending in a first direction parallel to the plurality of rows; and
at least one short side extending in a second direction intersecting the first direction, and
the at least a portion of the crack detection line is disposed adjacent to the at least one short side.

3. The display device of claim 2, wherein the crack detection line is disposed adjacent to at least a portion of the at least one long side of the driving circuit.

4. The display device of claim 2, further comprising a circuit board including a plurality of circuit board pads electrically connected to the display panel.

5. The display device of claim 4, wherein the crack detection line is electrically connected to at least a part of the plurality of circuit board pads.

6. The display device of claim 5, wherein
the plurality of circuit board pads comprise resistance test pads, and
the crack detection line is electrically connected to the resistance test pads.

7. The display device of claim 2, wherein
the at least one short side comprises a first short side and a second short side spaced apart from the first short side in the first direction, and
the crack detection line comprises:
a left crack detection line disposed adjacent to the first short side; and
a right crack detection line disposed adjacent to the second short side.

8. The display device of claim 7, wherein
the crack detection line comprises a connection crack detection line that electrically connects the left crack detection line and the right crack detection line, and
the connection crack detection line is disposed adjacent to one of the at least one long side of the driving circuit.

9. The display device of claim 1, wherein
the crack detection line comprises a first detection line and a second detection line spaced apart from the driving circuit, and
the first detection line is disposed between the second detection line and the driving circuit.

10. The display device of claim 9, wherein each of the first detection line and the second detection line comprises a structure forming a loop structure through a plurality of detection lines extending along the edge of the driving circuit.

11. The display device of claim 10, wherein the driving circuit comprises a comparison unit electrically connected to the crack detection bump.

12. The display device of claim 11, wherein the comparison unit applies a weight to compensate for a difference in wiring resistance between the first detection line and the second detection line.

13. The display device of claim 11, wherein the driving circuit further comprises a connection line electrically connecting the crack detection bump and the comparison unit.

14. The display device of claim 10, wherein
the crack detection bump comprises first to fourth crack detection bumps,
the first detection line comprises a first input detection line electrically connected to the first crack detection bump and a first output detection line electrically connected to the second crack detection bump, and
the second detection line comprises a second input detection line electrically connected to the third crack detection bump and a second output detection line electrically connected to the fourth crack detection bump.

15. The display device of claim 14, wherein
the first detection line has a structure in which the first input detection line and the first output detection line are connected to form a loop structure, and
the second detection line comprises a structure in which the second input detection line and the second output detection line are connected to form a loop structure.

16. The display device of claim 1, wherein
the plurality of bumps comprise an output bump and an input bump,
the plurality of signal lines comprise a data line electrically connected to the output bump or the input bump, and
the data line and the crack detection line are disposed on different layers.

17. The display device of claim 1, wherein the crack detection bump comprises a dummy bump disposed at an end of at least one row among the plurality of rows.

18. The display device of claim 1, wherein the plurality of bumps comprise a plurality of crack detection bumps arranged in multiple rows among the plurality of rows.

19. A display device comprising:
a display panel including:
a display area displaying an image;
a non-display area adjacent to the display area; and
a plurality of signal lines; and
a module crack detection line disposed in the non-display area and at an outermost side of the display panel; and
a driving circuit disposed in the non-display area, wherein
the driving circuit comprises a bump disposed in at least one row extending in a first direction,
the bump comprises a crack detection bump disposed in the at least one row,
the driving circuit comprises at least one long side extending in the first direction and at least one short side extending in a second direction intersecting the first direction, and
at least a part of the plurality of signal lines comprises a crack detection line disposed adjacent to the at least one short side of the driving circuit with the crack detection line making electrical contact with the crack detection bump.

20. A method of manufacturing a display device, the method comprising: preparing a display panel including: a display area displaying an image, a non-display area adjacent to the display area, a crack detection line disposed in the non-display area, and a module crack detection line disposed in the non-display area and at an outermost side of the display panel; preparing a driving circuit including at least one long side extending in a first direction and at least one short side extending in a second direction intersecting the first direction; pressing the driving circuit to the display panel so that the at least one short side of the driving circuit is disposed adjacent to the crack detection line and q crack detection bump is electrically connected to the crack detection line; and determining whether a crack has occurred by measuring a resistance of the crack detection line via the crack detection bump.

21. The method of claim 20, further comprising electrically connecting a circuit board including a plurality of circuit board pads to the display panel, wherein
the crack detection line is electrically connected to resistance test pads among the plurality of circuit board pads, and
the resistance test pads measure a resistance of the crack detection line to determine whether a crack has occurred.

22. The method of claim 20, wherein
the driving circuit further comprises a comparison unit electrically connected to the crack detection bump, and wherein
the comparison unit measures a resistance of the crack detection line to determine whether a crack has occurred.

23. The method of claim 22, wherein
the crack detection line comprises a first detection line and a second detection line spaced apart from the driving circuit,
the first detection line is disposed between second detection line and the driving circuit, and
the comparison unit compares resistances of the first detection line and the second detection line to determine whether a crack has occurred in the crack detection line.

* * * * *